United States Patent
Rhoads

(10) Patent No.: US 12,047,692 B1
(45) Date of Patent: Jul. 23, 2024

(54) IMAGE SENSOR FOR IMPROVED OPTICAL IMAGING

(71) Applicant: Transformative Optics Corporation, Portland, OR (US)

(72) Inventor: Geoffrey Burton Rhoads, West Linn, OR (US)

(73) Assignee: TRANSFORMATIVE OPTICS CORPORATION, Portland, OR (US)

( * ) Notice: Subject to any disclaimer, the term of this patent is extended or adjusted under 35 U.S.C. 154(b) by 0 days.

(21) Appl. No.: 18/056,704

(22) Filed: Nov. 17, 2022

Related U.S. Application Data

(60) Provisional application No. 63/381,639, filed on Oct. 31, 2022, provisional application No. 63/367,999, filed on Jul. 8, 2022, provisional application No. 63/365,482, filed on May 27, 2022, provisional application No. 63/362,508, filed on Apr. 5, 2022, provisional application No. 63/269,194, filed on Mar. 11, 2022, provisional application No. 63/267,892, filed on Feb. 11, 2022, provisional application No. 63/280,898, filed on Nov. 18, 2021.

(51) Int. Cl.
  *H04N 25/13* (2023.01)
  *H04N 25/706* (2023.01)

(52) U.S. Cl.
  CPC .......... *H04N 25/13* (2023.01); *H04N 25/706* (2023.01)

(58) Field of Classification Search
  CPC ............................ H04N 25/13; H04N 25/706
  See application file for complete search history.

(56) References Cited

U.S. PATENT DOCUMENTS 6,831,688 B2 * 12/2004 Lareau ................. G01J 3/0256
  348/340
11,128,819 B2 * 9/2021 Mazliach ............... H04N 23/11

OTHER PUBLICATIONS

Alleysson, David, et al., "Color demosaicing by estimating luminance and opponent chromatic signals in the Fourier domain", Laboratory for Audiovisual Communications, 6 pages, Swiss Federal Institute of Technology (EPFL), Lausanne, Switzerland.
Farsiu, Sina, et al., S. Farsiu et al. Multi-Frame Demosaicing and Super-Resolution of Color Images, Published in IEEE Transactions on Image Processing, vol. 15, No. 1, pp. 141-159, Jan. 2006.

* cited by examiner

*Primary Examiner* — Twyler L Haskins
*Assistant Examiner* — Angel L Garces-Rivera

(57) ABSTRACT

An imaging device capable of producing images or data with relatively high spectral diversity, allowing for creation of information-rich feature vectors, is provided. Among other things, such information-rich feature vectors may be applied to a range of artificial intelligence and machine learning applications. The imaging device may include a substrate having a baseline spectral responsivity function, multiple pixels forming a cell fabricated on the substrate, and spectral filters each configured to filter light based on a transmission function corresponding to a substantially broad portion of the baseline spectral responsivity function. The spectral filters may be notch filters. Each of the multiple pixels in the cell may be configured to receive light through each of the spectral filters. The transmission function of each of the spectral filters may be substantially different for each of at least a majority of the multiple pixels in the cell.

25 Claims, 20 Drawing Sheets

FIG. 23

| -21 | 57 | 86 |
|---|---|---|
| 12 | -98 | 32 |
| 25 | -39 | -55 |

IMAGE SENSOR FOR IMPROVED OPTICAL IMAGING

RELATED APPLICATIONS

This application claims priority and benefit under 35 U.S.C. § 119 from: U.S. Provisional Patent Application No. 63/280,898, titled "Notch-Pan Spectral Filtering Pattern And Processing Producing R, G, B, NIR, Pan 5-Channel Image Output," filed on Nov. 18, 2021; U.S. Provisional Patent Application No. 63/267,892, titled "Low Carbon Emission Manufacturing Of Colorimetric-Trained CMOS Image Sensors Having Superior Photonic Efficiency And Smaller Pixels," filed on Feb. 11, 2022; U.S. Provisional Application No. 63/269,194, titled "CMOS Image Sensor Optimized For Artificial Intelligence And Machine Learning Applications", filed Mar. 11, 2022; U.S. Provisional Patent Application No. 63/362,508, titled "Notchpan Enable CMOS Sensor," filed on Apr. 5, 2022; U.S. Provisional Patent Application No. 63/365,482, titled "Image Sensor For Artificial Intelligence And Machine Learning Applications," filed on May 27, 2022; U.S. Provisional Patent Application No. 63/367,999, titled "Color Image Sensor Utilizing Artificial-Intelligence-Enhancing, Mildly-Variegated Pixels," filed on Jul. 8, 2022, and U.S. Provisional Patent Application No. 63/381,639, titled "Image Sensor For Optical Imaging, Artificial Intelligence, and Machine Learning Applications," filed on Oct. 31, 2022. Each of the above-listed applications is hereby incorporated by reference in its entirety for all purposes.

BACKGROUND AND INTRODUCTION

Generally, individual pixels of an imaging sensor, such as those used in digital cameras and smart phones, include red, green, and blue color filters that selectively cut out a portion of light, based on color, in order to achieve color images. An electronic signal (e.g., the raw data) produced by such an imaging sensor is post-processed in a particular way to produce a color image, which is an example of conventional and well-known color digital photography. For instance, post-processing may include demosaicing, which is a digital image process used to reconstruct a full color image from the incomplete color samples output from an imaging sensor that is overlaid with the color filters. Details of the demosaicing process affect a variety of aspects of the resulting color photo.

Individual pixels of an imaging sensor may include a light sensor that produces an electronic signal based on the number of photons, or light intensity, that it receives. Common light sensors include sensors which are based on metal-oxide-semiconductor (MOS) technology. A complementary MOS (CMOS) sensor is sensitive to (e.g., can detect) the entire visible light spectrum with relatively high efficiency. The general practice of adding red, green, and blue color filters for color photography prevents the CMOS sensor from receiving all available light, which is a price paid for achieving color photography. The resulting reduction in light sensitivity of the imaging sensor may affect photography in low-light conditions, for example. Modern color imaging sensors generally receive substantially less light than is available as a result of the red, green, and blue color filters in front of the individual pixels. Thus, these imaging sensors sacrifice light sensitivity for color imagery. The color filtering in these imaging sensors may also lead to increased blurring of the finest details of images.

The red, green, and blue color filter array applied to imaging sensor pixels was developed in the late 1970's (by Eastman Kodak) and is called a Bayer filter (named after its inventor). The shortcomings noted above have been willingly tolerated for over forty years as an inherent sacrifice for having digital color imaging. These intervening years have produced dozens of improvements to the original Bayer filter design, but these improvements generally still rely on utilizing approaches based on spectral bandpass filtering. These bandpass approaches still give rise to the same shortcomings (e.g., using less light than is available) as before.

In pattern recognition and machine learning, a feature vector can include numerical features that represent an object. Artificial intelligence (AI) applications perform best when presented with relatively rich and higher dimensional data in the form of such feature vectors. For example, imaging data having relatively high spectral diversity provided to artificial intelligence applications as input data may lead to improved AI efficacy. Images produced by conventional digital photography are generally optimized for human visual consumption and not for machine learning.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 23 illustrates a 9×9 "super-cell" of 3×3 repeated arrays of pixels, which also includes a center circle of an output solution point, according to some embodiments.

DETAILED DESCRIPTION

Figure 1:
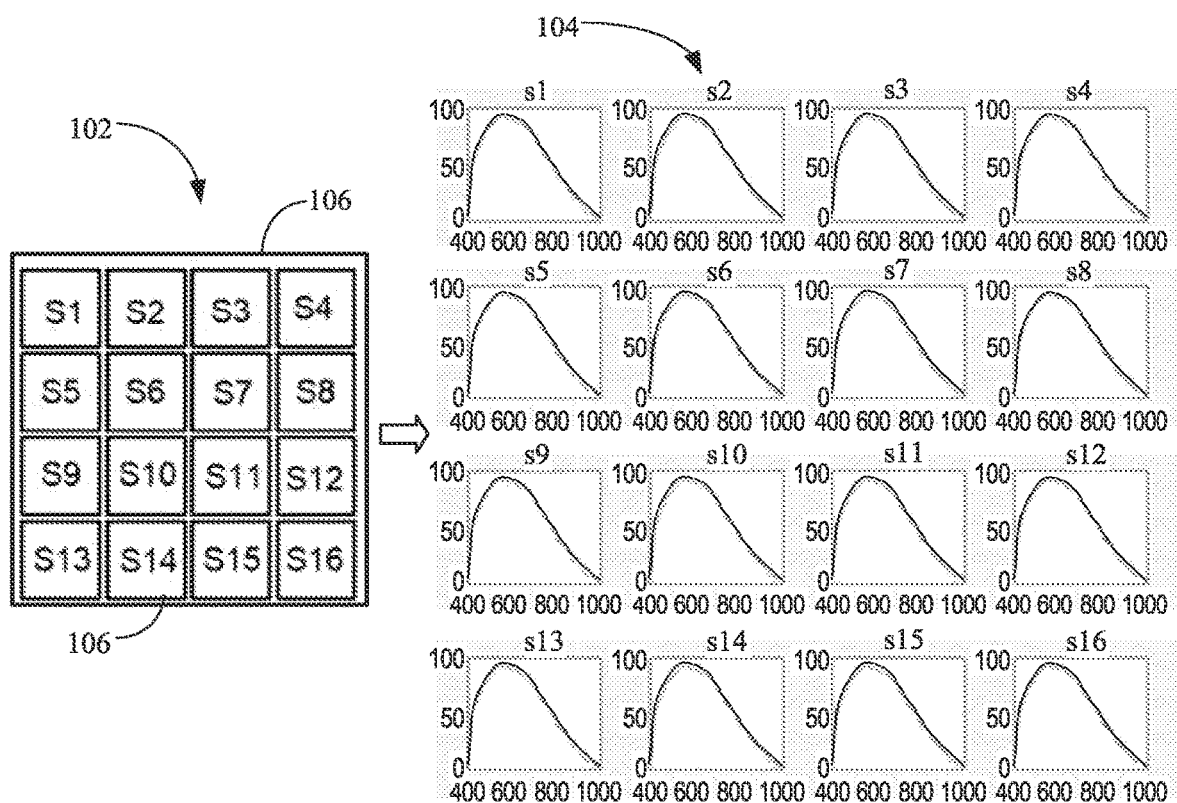
FIG. 1 illustrates a 4×4 array of pixels in a pixel cell for an imaging device and corresponding respective uniform spectral responsivities that mimic the unfiltered responsivity of a substrate, according to some embodiments.

Aspects of this disclosure are directed to the design, manufacture, and use of a complementary metal-oxide-semiconductor (CMOS) imaging sensor, or other type of similar imaging sensor, capable of producing images or data that can lead to creation of information-rich feature vectors. Among other things, such information-rich feature vectors may be applied to a range of artificial intelligence (AI) and machine learning (ML) applications (hereinafter, AI and ML will collectively be referred to as "AI").

Charge-coupled device (CCD) and CMOS imaging sensors have dominated the digital camera market for decades. Monochromatic, color, and specialty cameras that use such imaging sensors are in wide use for a multitude of applications, including AI applications. These cameras may produce data that can be used as input for AI applications. Generally, the richer the information content of data produced by imaging sensors, the better the results will be for AI-based applications.

In some embodiments, quality metrics may be used to judge the quality of AI results, comparing one AI solution with another AI solution. Such quality metrics may be used to keep track of right answers and wrong answers in applications requiring such discrete answers. For example, AI applications may consider questions such as "cancer or not cancer?" (e.g., medical applications); "red, green, or yellow apple?"; "facial match or not facial match?" (e.g., image recognition applications). In another example, an AI application may also perform discrete sorting of ripeness values in machine-vision-assisted standardized fruit picking machines, saving ripeness information on non-picked fruits for later scheduled picking. Other AI applications may require continuous (non-discrete) forms of decisions, such as scene detection or recognition for self-driving vehicles.

Quality or accuracy of results (e.g., output) of AI applications may be quantifiable by, for example, comparing the results with ground truths, which is information that is known to be real or true, provided by direct observation and measurement (e.g., empirical evidence), as opposed to information provided by inference. Herein, the term "AI-efficacy" refers to the quality or accuracy of results of an AI application. Embodiments discussed herein may allow for achieving relatively high AI-efficacy.

The discussion herein are generally directed to how certain design, manufacturing, testing, and usage approaches apply to these sensors in a way that leads to data that can result in relatively high AI-efficacy in the field of optical imaging utilizing CMOS image sensors. In some implementations, a goal of relatively high AI-efficacy may be traded off against light sensitivity, preservation of spatial contrast, and/or the total lifetime cost of a device. In this case, the AI-efficacy which is incrementally lost by slightly blurring an image may be made up by a larger amount of AI-efficacy gained by higher spectrometric measurement accuracy.

A primary driver of AI-efficacy may be based on spectral diversity, as described below. Thus, some embodiments may involve the creation of arbitrary yet measurable spectral or optical diversity that leads to relatively high, application-defined AI-efficacy. The word "arbitrary" indicates that certain lower cost approaches of creating such spectral diversity can compete well with higher cost approaches that conform to human-aesthetic and/or scientific notions of order. For example, attaining superior AI results may be more important than trying to design an image sensor that has uniform spectral bins, such as multi-spectral imagers (MSI) or hyper-spectral imagers (HSI). Indeed, MSI and HSI may both represent a certain kind of best-case optimization if spectral differentiation becomes an isolated, centrally dominant factor in how to define AI-efficacy for particular applications. Generally, there will always be applications where a high signal to noise ratio isolation of individual wavelengths is an end in itself, and MSI/HSI cameras will likely be the instrument of choice in such applications.

In some embodiments, an imaging device includes a substrate having a baseline spectral responsivity function, multiple pixels forming a pixel cell that is fabricated on the substrate, and spectral filters that are each configured to filter incoming light based on a transmission function. A final, ultimate quantum efficiency (QE) responsivity function will be not only a function of the baseline spectral responsivity function and a proactive spectral filtering transmission function, but also include the physical properties of surface reflections and most often lens-based spectral properties as well. The highlight of the spectral filtering transmission function itself is intended to simplify the design parameters available to the designer, where it should be stated here that these additional factors will all play a role in a final QE responsivity function. The transmission function may also include one or more local minima. For example, the transmission function may be a polynomial that expresses relative transmission as a function of wavelength. Such a polynomial may be a high-order polynomial (e.g., of order 4 to 10, or higher) that may be expressed as a Fourier series, in some implementations. The baseline spectral responsivity function for a substrate may be an empirical function that is based on physical properties of the substrate. The spectral filters may be notch filters, which generally attain a value of substantially zero (e.g., 2% or less) at some small range of wavelengths, or it may be notch-like and simply subtractive but not subtracting all the way to zero. Each of the multiple pixels in the pixel cell may be configured to receive light transmitted via (e.g., "through" in the case of transmission) each of the spectral filters. The transmission function of each of the spectral filters may be substantially different (as more particularly detailed below) for each of at least a majority of the multiple pixels in the pixel cell. For example, if a pixel cell has three rows and three columns, then the transmission function of each of the spectral filters for at least five of the nine pixels of the pixel cell may be substantially different from one another. For another example, if a pixel cell has two rows and three columns, then the transmission function of each of the spectral filters for at least four of the six pixels of the pixel cell may be substantially different from one another. It should be appreciated that no physical implementation of a filter will precisely be defined by a perfect polynomial or other type of mathematical function; in practical terms, there will be some specification on how empirically verified spectral functions come within some established numeric proximity to some "ideal" function, for example, a function with empirically measured deviations of no more that 5% of X mathematical function. Thus, Taylor series polynomials or Fourier coefficients or Legendre function coefficients can be used to drive a filter-choice design, with manufacturing tolerances subsequently specified for the actual building and testing of sensors themselves.

In some embodiments, the imaging device may further include a cell array that includes the pixel cell repeated horizontally and vertically across the substrate. For example, for a pixel cell having 4×4 (sixteen) pixels, the cell array may include 257 pixel cells horizontally and 192 pixel cells vertically for an imaging device having a resolution of 1028×768. In some implementations, a pixel cell may include n rows and m columns, wherein both n and m are 2 or more, and at least one of n or m is 3 or more (e.g., 2×3 or 3×2 pixels minimum), in some implementations. Also, the transmission function of each of the spectral filters may be substantially different for at least five of the multiple pixels in the pixel cell. For example, substantially different transmission functions may have differing magnitudes, local minima and local maxima, and shapes, and/or such features occurring at different wavelengths.

In some particular embodiments, each of the multiple pixels in the pixel cell have at least 30%, at least 50%, at least 70%, and in some instances 85% or more efficiency of photo-electron generation based on the filtered light, compared to 100% efficiency of unfiltered photo-electron generation of the substrate. For example, photo-electron generation occurs in each pixel area of the substrate in response to light impinging on that part of the substrate. 100% efficiency may be said to occur if all available (e.g., unfiltered) light impinges on the pixel area of the substrate. In some implementations, all of the multiple pixels in the cell, in aggregate (e.g., a grouping of all the pixels or the cell array of the imaging device), may have at least 40% efficiency of photo-electron generation based on the filtered light, compared to 100% efficiency of unfiltered photo-electron generation of the substrate. (Other implementations may have at least 60%, at least 80%, or in some instances 90% or more efficiency based on the filtered light.) In some examples, at least two of the multiple pixels in the pixel cell, based on the respective filtered light each receives, have non-zero, substantial spectral sensitivity (e.g., 10%, 20%, 30%, or more) across the entire range of the baseline spectral responsivity function. For example, the transmission functions of at least two of the multiple pixels in the pixel cell do not have substantially-zero values anywhere in the full spectral range of the baseline spectral responsivity function. Contrary to specialized human visual system (HVS) sensors such as the red, green, and blue filters of the Bayer design, or even cyan, magenta, and yellow of related prior art HVS sensors, many implementations described in this disclosure teach proactive extension of the non-zero sensed wavelengths into the near ultraviolet and/or the near infrared. As such, photoelectrons generated by light with these wavelengths will be contributing signal to the implementations and concomitantly increasing the sensitivity of the sensor in a manner which the HVS sensors do not.

In some particular implementations, the transmission functions corresponding to at least two of the multiple pixels of the pixel cell may be approximated by a sixth order, fifth order, fourth order, or lower-order polynomial such that the approximation has less than a 5% root mean square (RMS) error between the approximation and a measured spectral profile of the at least two of the multiple pixels. (In some implementations, the approximation has less than a 3%, less than a 2% or even less than a 1% RMS error.) This choice of sixth order or lower polynomials is a matter of simplification and "rules of thumb" that attempt to well-characterize a very wide inventory of existing spectral filtering dyes and pigments. Thus, sixth order is chosen not at all as an upper limit but as an aide to design. Indeed, when the discussion on filtering expands beyond classic dyes and pigments to dichroic layering and quantum dots, higher orders than 6 will be called upon. The transmission function of each of the spectral filters may be substantially different (as discussed below) for at least the majority of the multiple pixels in the pixel cell if the transmission function corresponding to any of the multiple pixels is spectrally shifted by any amount.

In various embodiments, a method of manufacturing an imaging device may include fabricating multiple pixels that form a pixel cell on a substrate having a baseline spectral responsivity function and placing spectral filters on an input side of the multiple pixels. The spectral filters may be configured to filter light based on a transmission function including one or more local minima. Each of the multiple pixels in the cell may be configured to receive light through each of the spectral filters. The transmission function of each of the spectral filters may be substantially different for each of at least a majority of the multiple pixels in the cell.

In some embodiments, an imaging device includes spectral subtracting, or even notching, elements, or optical filters, that select particular wavelength or wavelength ranges of light to transmit (or to not transmit) to a substrate of the imaging device. The wavelength or range of wavelengths for a first portion of the imaging device, such as an individual pixel sensor, may be different from that of a second portion of the imaging device, such as an adjacent individual pixel sensor. This difference may lead to the imaging device producing imaging data having a spectral diversity that is greater compared to the case of uniform spectral filtering of the imaging device. Generally, imaging data having greater spectral diversity provided to AI as input data may lead to improved AI efficacy.

In some particular embodiments, as described above, an imaging device, such as a CMOS image sensor, may include multiple pixels forming a pixel cell, which may be a part of an array with multiple cells. As used herein, a pixel is an individual optical sensing element (which may be a fundamental element of a sensor). In some implementations, as described in examples herein, sixteen pixels may form a pixel cell. In other implementations, as described in other examples herein, nine pixels may form a pixel cell. Each of the multiple pixels has a substrate, which may be the same or different for each of the pixels. In other words, in some cases a single substrate may be used for all of the pixels while in other cases, each pixel may be fabricated on a substrate that is different for other pixels. The substrate(s) may be substantially pure silicon (e.g., raw silicon) or doped silicon. A spectral subtracting and/or notching element, or other spectral filter, may be applied to, or integrated with, the substrate of one or more of the multiple pixels. The spectral subtracting and/or notching element may be configured to prevent a select wavelength or range of wavelengths of light from transmitting to the substrate of the cell. In other words, the spectral-modifying element acts as an optical filter and may include a chemical dopant, a dye, a pigment, quantum dots, and/or may function based on optical or dichroic interference, just to name a few examples. The spectral-modifying element may be applied to or integrated with individual pixels in the cell or integrated with all of the pixels in the cell. In various embodiments, the wavelength or range of wavelengths of spectral filtering for a first pixel of the cell may be different from that of a second pixel of the cell. In some embodiments, the wavelength or range of wavelengths of filtering may be different for each of the pixels in the cell. In some embodiments, the shape or size of the spectral transmission curve of the spectral notching element in the first pixel is different from that of the second pixel. In some cases, the spectral notching element may be further configured to modify a photonic spectral diversity of one or more of the multiple pixels in the cell to which the notching element is integrated or applied.

In some particular embodiments, for an imaging device, such as that described above, spectral filtering for one pixel of the cell may be different from that of the other pixels of the cell. Filters having such spectral differences may be selected from a relatively large inventory of commercially available and/or physically realizable spectral filtering dyes and pigments. For example, the inventory may include many dozens or even hundreds of spectral functions from which to select, each having varying shapes and slopes in their respective spectral functions. To determine a maximum spectral diversity of a subset of filters among the inventory, the following steps may be performed. For example, a subset of nine filters may be selected from among an inventory of 20, 50, or 100 candidate filters. The nine selected filters may be placed respectively in front of nine pixels of a cell of an imaging sensor. Accordingly, in view of all the filters available in the inventory from which to make selections, all nine of the selected filters will be as different from one another as possible. A first step in a selection process may be to select a single initial filter having at least three distinct slopes between 350 nm and 800 nm in its spectral function, for example. In a next step, a second filter may be selected and a dot product between its spectral function and that of the first filter may be calculated. In a next step, a third filter may be selected and a dot product between its spectral function and that of each of the first two filters may be calculated, resulting in a total of three dot products amongst the three filters. In a next step, a fourth filter may be selected and a dot product between its spectral function and that of each of the first three filters may be calculated, resulting in a total of six dot products. In a next step, a fifth filter may be selected and a dot product between its spectral function and that of each of the first four filters may be calculated, resulting in a total of ten dot products. In a next step, a sixth filter may be selected and a dot product between its spectral function and that of each of the first five filters may be calculated, resulting in a total of fifteen dot products. These steps are repeated until dot products of pair-combinations of spectral functions of all the filters in the inventory are calculated. For example, these steps may be performed for 30 or 40 candidate filters, and the number of dot products resulting from these steps may reach into the millions. In a subsequent step, these many millions of combinations may be analyzed to find the 9 most spectrally diverse filters to be used for a 3×3 color filter array cell, such that the combined total dot product of all pairs is minimized.

An implementation of the embodiment described above may be a method of manufacturing an imaging device configured to produce image data with relatively high spectral diversity, allowing for creation of information-rich feature vectors. The method may include determining the most spectrally diverse N spectral functions among a set of spectral functions, fabricating N pixels that form a cell on a substrate having a baseline spectral responsivity function, and placing N spectral filters respectively on an input side of each of the N pixels, wherein each of the N spectral filters is respectively configured to filter light based on the selected N spectral functions. In some particular embodiments, determining the most spectrally diverse N spectral functions comprises calculating dot products of substantially every combination of pairs of spectral functions among the set of spectral functions, and determining sums of substantially every combination of N of the dot products, wherein the most spectrally diverse N spectral functions correspond to a combination of the N dot products having the lowest sum. Other techniques for determining spectral diversity, other than relying on dot products, may be used and claimed subject matter is not limited to any particular technique.

In some embodiments, an AI application may receive, as input, output or an output signal of a sensor which, in some cases, may be an image. The exact nature of the pixel-sensed data may not be important for the application, which may otherwise only use an output of RGB values for each pixel, simply because RGB sensors happen to provide three independent channels of information. This output, herein called "image data", of the imaging device may be derived from some or all of the multiple pixels in the pixel cell. Thus, output of a pixel cell, which may be a three-valued RGB vector, for example, may be a function of all pixels in the pixel cell, or a function of a pixel and its neighboring pixels in the pixel cell, or a function of pixels in one pixel cell and pixels in a neighboring pixel cell. In one particular embodiment, any given output of an image pixel may be a function of the image pixel and up to 143 raw data values of other pixels. This particular embodiment may involve the output values of a 4×4 cell of pixels derived from a wider 3×3 array of the 4×4 cells. This gives a total input pixel region of 12×12 pixels all contributing weighted signal values to each output pixel value, for example, thus resulting in up to 144 raw data values. In another such example, any given output of an image pixel may be a function of the image pixel and up to 80 raw data values of other pixels. This embodiment may involve the output values of a 3×3 cell of pixels derived from a wider 3×3 array of the 3×3 cells. This gives a total input pixel region of 9×9 pixels, all contributing weighted signal values to each output pixel. (The references to "up to 144" and "up to 81" are in acknowledgement that weighting coefficients for certain of these pixels may be zero, which can lead, effectively, to use of fewer raw data values. For instance, in different embodiments, the output of an image pixel may be a function of the subject image pixel and (a) 108-143 other pixels; (b) 81-107 other pixels; (c) 61-80 other pixels; (d) 46-60 other pixels; (e) 34-45 other pixels; (f) 25-33 other pixels; etc.).

In some embodiments, a color filter array for use on a photosensor array comprises plural pixels, the color filter array including N filter elements, where N is at least four, characterized in that: each of the N filter elements has a spectral response function including a deepest notch; the N deepest notches of the N spectral response functions are at different wavelengths; and shapes of the N deepest notches are different, in that a discrete normalized cross-correlation operation performed between a 100 nm excerpt of one spectral response function, centered on the deepest notch of the function and sampled at 2 nm or less intervals, with a 100 nm excerpt of another spectral response function, centered on the deepest notch of the function and sampled at 2 nm or less intervals, yields a result less than 0.95, for all possible pairings of the N spectral response functions. The color filter array may include M×M element cells of filter elements, tiled in orthogonal directions across the color filter array, where M is 2, 3, 4 or 5, and each of the cells includes the N filter elements. In some implementations, N=M*M. The discrete normalized cross-correlation operation may yield a result less than 0.8 for all possible pairings of the N spectral response functions. In some embodiments, a photosensor assembly includes a photosensor and the color filter array described above.

In some embodiments, a color filter array for use on a photosensor array comprises plural pixels and the color filter array includes a first filter element having a first spectral response function with a deepest notch at a first wavelength, a second filter element having a second spectral response function with a deepest notch at a second wavelength, and a third filter element having a third spectral response function with a deepest notch at a third wavelength. The first, second, and third wavelengths may each be between 450 and 750 nm and differ from one other by at least 20 nm. A normalized cross-correlation of a 100 nm band of the first spectral response function centered at the first wavelength, with a 100 nm band of the second spectral response function centered at the second wavelength may yield a result less than K; a normalized cross-correlation of a 100 nm band of the first spectral response function centered at the first wavelength with a 100 nm band of the third spectral response function centered at the third wavelength may yield a result less than K; and a normalized cross-correlation of a 100 nm band of the second spectral response function centered at the second wavelength with a 100 nm band of the third spectral response function centered at the third wavelength may yield a result of less than K, where K may be 0.9, for example.

The color filter array in which the deepest notch regions of 100 nm may also include a second local minimum higher than or equal to the deepest notch, where the second local minimum differs from the deepest notch by at least 30 nm.

FIG. 1 schematically illustrates a 4×4 array of pixels (e.g., pixel sensors) of a pixel cell 102 for an imaging device, and corresponding respective spectral responsivities 104. according to some embodiments. Pixel cell 102 may be tiled (e.g., repeated) across a CMOS imaging device, for example. Each pixel is labelled S1, S2 . . . S16 for identification purposes. Spectral responsivities 104 (e.g., silicon-substrate spectral responsivity functions that may be typical of 2020-era CMOS imaging sensors) are plotted as relative responsivity (e.g., 0 to 100%) as a function of wavelength, ranging from 400 to 1000 nanometers (nm). Spectral responsivities 104 may be different for different materials (e.g., silicon versus doped silicon versus germanium, etc.)

In particular, the 4×4 array of pixel cell 102 includes individual pixels 106 (e.g., cell members) and the corresponding spectral responsivity of each of the pixels is illustrated in 104. Each of the pixels in this example has NULL spectral filtering. In other words, the "natural" spectral responsivity (e.g., of the semiconductor material of which the pixel cells are manufactured) is relied upon for photoelectron generation ("sensitivity") because no spectral filtering is applied. Advantages derived from this condition may generally involve the explicit trade-off between total photoelectron generation and AI-efficacy. For example, NULL filtering of the array of sixteen pixels does not produce the spectral diversity that is desirable for AI-efficacy. However, this null filtering maximizes (in the context of light energy throughput) photoelectron generation performance by allowing all available light to impinge onto the pixel cells. In contrast, non-null filtering would block (e.g., by light absorption by the filter material or light reflection away from the pixel cells) some of this available light. NULL filtering may also lead to maximizing a Modulation Transfer Function (MTF) optimization which, like spectral diversity, may also be important for AI-efficacy. MTF is a measurement of the ability of an optical system or element to transfer contrast at a particular resolution from an object to its image. Generally, MTF quantifies the overall imaging performance of a system in terms of resolution and contrast. Also, the null-state of filtering generally optimizes this MTF. Of particular note is that there exist as-yet non-commercially available approaches to spectral filtering which are designed to preserve the ability of most or all photons to reach a sensor's photo-active detection region through a form of prismatic diversion. This approach is contrasted with dyes and pigments which absorb photons and thus eliminate their ability to generate sensor signal. The 2022-era challenge with these new types of spectral-photon diversion as opposed to absorption is that these new types are not easily mass produced. Nevertheless, embodiments in this disclosure teach that practitioners monitor the commercial development of these non-absorptive spectral filtering approaches and use them in place of dyes/pigments once cost and scalability thresholds are met. Absorptive dyes and pigments dominate the 2022-era inventory of commercially available materials, which then dominates most of the detailed disclosures herein.

The embodiment illustrated in FIG. 1, in the case for a silicon-substrate device, because of no applied (null) spectral filtering, represents the maximum total photoelectron generation potential. Thus, the total number of generated photoelectrons N can only decrease from this maximum via some form of spectral filtering (with the exception noted in the previous paragraph). Using an economic analogy, the total number of photoelectrons N generated by a device (with or without optical filtering) is a quantity that may become a type of "currency" with which to "purchase" spectral diversity and therefore spectral-AI-efficacy. In other words, tradeoffs may occur between spectral diversity and total number of photoelectrons N generated. Generally, it is beneficial to "maximize" the total number of photoelectrons N generated (e.g., spectral throughput) for a given image light field to improve light sensitivity (e.g., photography in low-light conditions) and signal to noise ratio, among other things. On the other hand, it may be generally beneficial to "maximize" spectral diversity to increase the amount of information that may be utilized by AI applications, for example. These concepts are further explained below.

Figure 2:
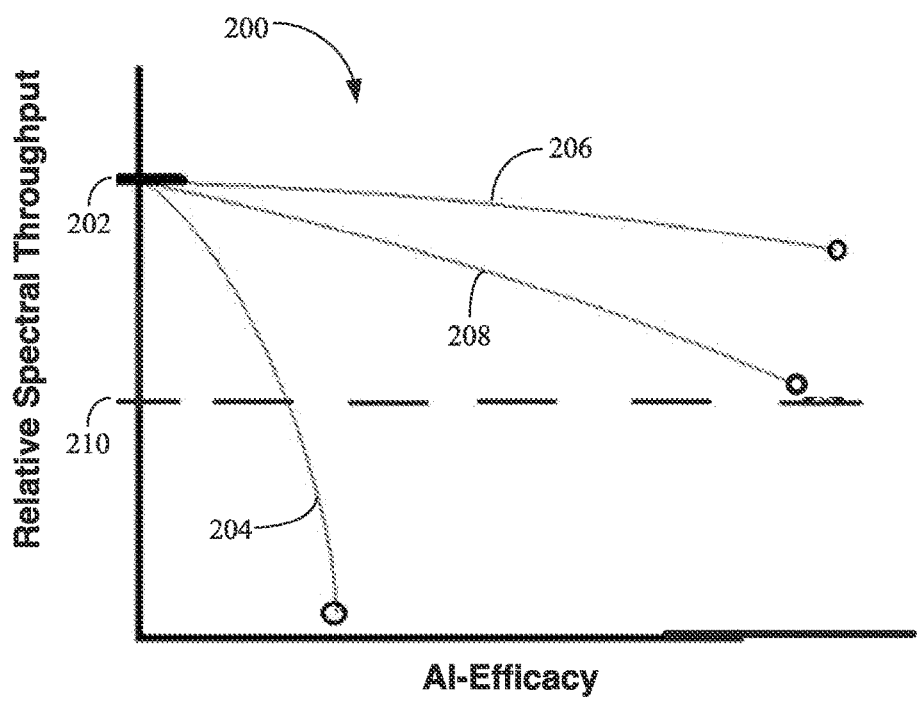
FIG. 2 is a graph that illustrates an amount of spectral throughput, in terms of the total number of photoelectrons that may be measured, of an imaging device as a function of AI-efficacy, according to some embodiments.

FIG. 2 is a didactic graph 200 that illustrates an amount of spectral throughput (e.g., as a function of selective optical filtering, ultimately conceived of as the total number of photoelectrons generated by all pixels for any given scene) by a device (e.g., an imaging device that includes pixel cell 102) as a function of AI-efficacy. Graph 200 may be considered by a designer of such an imaging device while studying the trade-off between total number of generated photoelectrons N and AI-efficacy. A level 202 along the vertical axis and placed directly on the vertical axis represents null filtering, corresponding to maximum throughput (for the physical situation, e.g., the substrate at hand). Referring back to the currency and purchase analogy introduced above, there are numerous ways to "spend" a total photoelectron generation budget, purchasing some amount of spectral diversity but perhaps over-filtering the light that could otherwise be detected and turned into an imaging signal. The over-filtering (e.g., low optical throughput) case may be represented by curve 204 and may lead to relatively low AI-efficacy even though one is spending the throughput extensively (an argument can be made that this is the situation with the Bayer paradigm of filtering). On the other hand, there are cases where toxic materials, water-thirsty and energy-hungry manufacturing practices, and poor device-use choices could efficiently spend the total photoelectron generation budget to buy AI-efficacy. These cases, represented by curve 206, associated with relatively high optical throughput, may detrimentally affect the overall lifetime cost (monetary and environmental), and thus some all-in definition of cost will make curve 206 undesirable. Curve 208 represents substantially optimal cases having relatively low lifetime costs while providing desirable (e.g., inexpensive) spectral diversity. A level 210 along the vertical axis represents a possible final budget (e.g., referred to as "N") of how much of the total photoelectron potential can be spent. Accordingly, an optimum, low lifetime cost for desirable spectral diversity may occur at or near the terminus of curve 208.

Descriptions herein may help lead a designer of imaging devices, for example, to design devices having relatively large amounts of spectral diversity as traded-off against cost and total photoelectron generation (N), while considering MTF degradation. FIG. 2 may provide a guide at how spectral diversity may be designed into a 4×4 array of pixels or any n×m array of pixels wherein both n and m are greater than one and at least one of them is greater than 2, for example. In some implementations, a more intricate problem being solved during designing may be the creation of spectral designs or other spectral filtering schemes, described below, that solve a tri-calculus of a) cost, b) photo-electron-generation, and c) balanced-AI-efficacy. Balanced-AI-efficacy may be further refined and defined by specific applications, such as superior histologic pathology detection, for instance, or advanced forgery detection, among other super-specific examples.

Historically, for example, the forty-plus year-old approach to pixel filtering known as Bayer Filtering has been a driving concept wherein spectral filtering profiles need to mimic, in the Bayer case, the red, green, and blue photo-receptors of the normally functioning human eye. Color scientists are aware that one can only be so good at producing image pixels that closely match the colorimetric coordinates set forth by CIE (e.g., CIE 1931, designed by the International Commission on Illumination). Thus, there have been, and still are, acceptable error conditions created by the economic choices made in designing and manufacturing the spectral profiles of 'red', 'green', and 'blue'. Embodiments described herein, follow an approach that uses optical filtering that is different from Bayer filtering.

An aspect described herein is that MSI and HSI binning solutions remain applicable even when using more arbitrary forms of individual pixel spectral profiles. Both linear algebraic and 'ML-kernel' based transformations carry out data transformations into MSI-HSI forms, as described below.

With MSI outputs, solution transformations may be applied in implementations involving generalized pixel response (GPR) functions (e.g., using spectral modifying elements or "TuLIPs" approaches (Tuned Linearly Independent Polynomials)), as well as for RGB outputs, near infrared (NIR), and their various combinations. GPR functions are more generalized than functions that map to, for example, cone types in the human eye. Instead, GPR functions, which may be a set of spectral filtering functions, may involve linear algebraic principles to affect solution transformations or may involve training ML-based solution kernels that directly map raw pixel data outputs to pixel regions (e.g., of an imaging sensor) that contain various channel solution formats. For a particular example, such machine learning-based solution kernels may directly map raw pixel data outputs to pixel cells that contain R, G, B, and 2 NIR channel solution formats, mapped onto the pixel grid of an imaging sensor. Such a mapping back onto an underlying pixel grid of an imaging sensor may also be applied to the Bayer filter, where the so-called luminance solution may be mapped directly onto a pixel grid, while the so-called chrominance solutions may be mapped to a 2×2 grid that is coarser than the underlying pixels. This type of mapping solution may be generally based on linear algebra. One form of this type of mapping is the 'color correction matrix'. This matrix has played a very important role in dealing with the challenges of matching low-cost dyes and pigments precisely to the optimized X, Y and Z curves of the CIE color system. Similar linear algebraic mapping is described herein for GPR functions.

Regarding AI applications, generally there are both simple and complex approaches to the creation of feature vectors. Early CMOS sensors did not include elements associated with feature vectors directly on the CMOS sensor itself. Such chip-level integration, however, may be a cost-effective approach to implementing AI technology. For embodiments where such elements are directly on the CMOS sensor itself, discussions herein describe processing approaches that result in "directional texture vectors", as but one class of new types of feature vectors which can be directly produced within very early stages of pixel processing. Some of these vectors may be almost exclusively non-linear in nature. For AI, feature vectors that already include certain component data may nevertheless be further enriched by including this non-linear data in the feature vector itself.

Two particular, somewhat opposite, application scenarios are herein provided as examples. Scenario 1 may involve histological slide imaging, where one not only may have control over the exposure times and lighting amounts that illuminate subject slides, but one may also have the opportunity for 10 or 20 exposures and structured lighting may be utilized. providing different spectral illuminations of the slides within each individual exposure. This scenario provides rich spectral diversity when both AI and a CMOS device is used along with this multi-exposure structured light. This scenario provides for plenty of light in the application, even if a given slide needs to be imaged at faster than 1 second per slide (the exposures and light-change periods may all be less than one tenth of one second events, for example). In this case where there is plenty of light, one may choose beforehand that the sensor be designed so that it may utilize about two-thirds of the total number of generated photoelectrons N in order to get the absolute maximum AI-efficacy possible within the overall 10 to 20 frame data set, subject to stringent low-lifetime-cost choices during the detailed design process. The designed sensor may thus "spend" two out of three photoelectrons in pursuit of AI-efficacy.

As a second particular example, scenario 2 may involve applications where light levels are relatively low and cannot be artificially increased via longer exposure times or artificial addition of light to the illumination of subject matter (or scenes). Scenario 2 may also involve device manufacturing where ever-smaller pixel sizes are desired. In such a case, one may still require a designer and/or manufacturer of the device to follow very high standard ecological best-practices. But in this case, one may only be willing to spend 20% of the total number of generated photoelectrons N, thus leading to a device having 80% light sensitivity relative to a monochromatic CMOS sensor. Referring back to FIG. 2, these application requirements drive where the budget-level 210 is set.

As explained above, AI-efficacy may generally derive from spectral diversity. For example, spectral diversity may be created via spectral filtering. In many current commercial CMOS image sensors (other than, perhaps, the somewhat exotic sensors that utilize spectrally-dispersive, diffractive structures within the light path immediately in front of a sensor plane (alluded to in paragraph 0045)), spectral filtering involves subtractive pixel-filtering using dyes, pigments, quantum dots, other such nanoparticles, and various recipes of organic and inorganic molecules. As mentioned above, this approach subtracts photoelectrons that would otherwise be generated in a pixel sensor. In a sense, a designer may "purchase" AI-efficacy by selectively spending (e.g., reducing N) photoelectrons. Such selective purchasing may be a function of the amount of spectral filtering and the spectral profile of the subtraction.

There are approaches to spectral filtering that do not involve subtraction of photons, such as the case for absorptive filtering. These approaches may involve, for example, spectrally diffractive elements placed in front of pixels. In some embodiments, these approaches may be used for creating spectral diversity. However, discussions herein are generally directed to subtractive approaches, which thus 'spend' a photoelectron budget.

Figure 3:
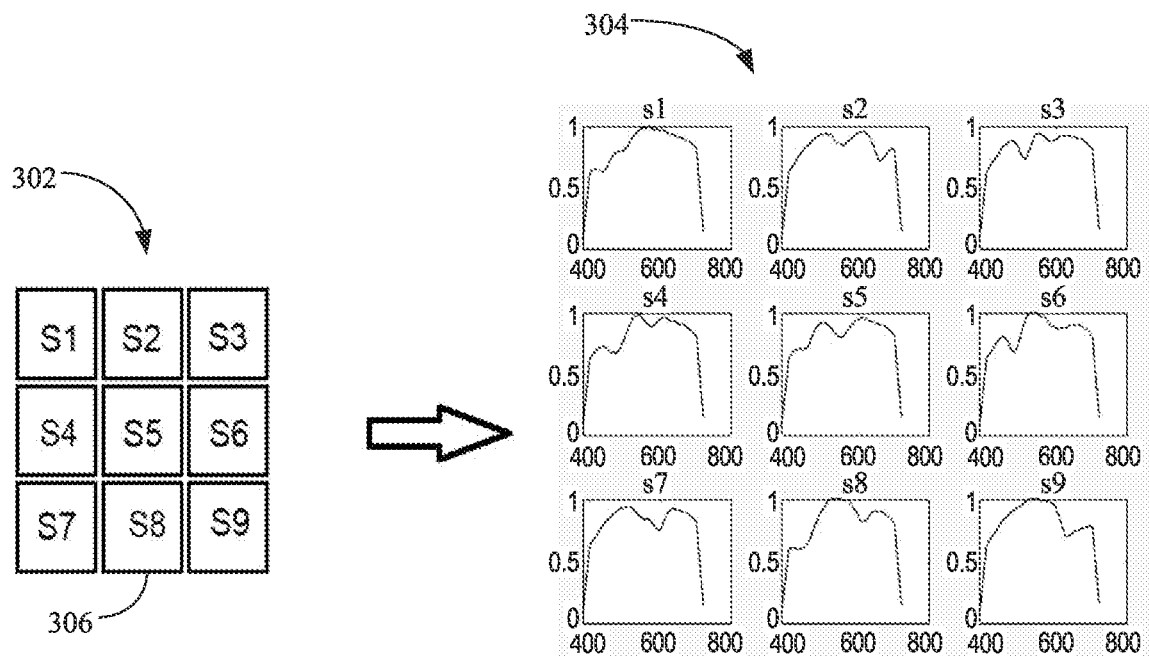
FIG. 3 schematically illustrates a 3×3 array of pixels of a pixel cell for an imaging device, and corresponding respective spectral responsivities, none of which are the same as any other, according to some embodiments.

FIG. 3 schematically illustrates a 3×3 array of pixels (e.g., pixel sensors) of a pixel cell 302 for an imaging device, and corresponding respective spectral responsivities 304. according to some embodiments. Similar to pixel cell 102, pixel cell 302 may be tiled (e.g., repeated) across a CMOS imaging device, for example. Each pixel is labelled S1, S2 . . . S9 for identification purposes. Spectral responsivities 304 (e.g., silicon-substrate spectral responsivity functions that may be typical of CMOS imaging sensors) are plotted as relative responsivity (e.g., 0 to 100%) as a function of wavelength, ranging from 400 to 800 nm. Spectral responsivities 304 may be different, at least in part, for different materials (e.g., silicon versus doped silicon versus germanium, etc.)

In particular, the 3×3 array of pixel cell 302 includes individual pixels 306 (e.g., cell members) and the corresponding spectral responsivity of each of the pixels is illustrated in 304. Spectral filtering is applied to each of the pixels such that the spectral responsivity of each pixel may be unique (e.g., the spectral responsivity of any pixel is different from all the other pixels in the pixel cell). In other words, all nine pixels in the cell have spectral response functions that are at least slightly different from one another. For example, "slightly different" spectral response functions may result from design and manufacturing acts applied to each of the pixels in which, in some measurable way (e.g., via spectral measurements), one pixel is at least slightly different from its neighboring pixels. Thus, each pixel in the 3×3 pixel cell has its own unique spectral signature. Strictly speaking, mathematically, they are indeed linearly independent from one another and as a collective group. In this example, these pixels have spectral responsivities relatively close (e.g., within very small deviations) to that of a silicon (or other) substrate spectral response function (e.g., for null filtering). Spectral differences, however, may provide at least a small amount of spectral diversity while allowing a relatively large amount of light to reach the pixels. As mentioned above, AI applications may perform well when presented with richer and higher-dimensional data, which may be provided by an image sensor including pixel cells such as 302.

The particular embodiment illustrated in FIG. 3 largely concentrates on the visible region of the light spectrum. Sensors may be optimized to mimic human vision while also being tuned for producing images and/or data that is well-suited for generating AI feature vectors. For example, examples of such mimicking of human vision may be color cameras and color image sensors that behave like spatially-resolving colorimeters, which are designed to measure light as it appears to standard human observers, thereby emphasizing light's color. Spatially-resolving means that a 'scene' can be resolved into variations of brightness and color.

There are numerous ways to spectrally filter light provided to individual pixels. For example, a color filter array (CFA), may use dyes and pigments to filter light in specified regions of the light spectrum. The digital color sensor industry will often use the term 'color resist' to refer to such methods. The origin of this name traces back to the use of photolithography and the associated 'apply and remove' processes that dominate much of today's semiconductor processing methods. Other spectral filtering methods may involve using quantum dots as a spectrally-modulating material. Still other methods may involve metalens technology that may redirect or scatter light as opposed to absorbing light.

In some embodiments, as is the case for spectral responsivities 304, differences in spectral responsivities among pixels in a cell (e.g., resulting from spectral filtering) may be relatively small. Such a pixel cell may be described as being spectrally 'mildly variegated'. Claimed subject matter, however, is not limited to variegated pixel cells combined with CMOS-type sensors, or their use with AI, since other implementations may involve other combinations of such elements or features. In some embodiments, mildly variegated spectral responsivity functions may be called tuned linearly independent polynomials (TuLIPs).

In the particular example of FIG. 3, inspection of spectral responsivities 304 show that about 10% of the available light impinging onto a pixel (e.g., 306) may be selectively filtered out (10% filtering), relative to an unfiltered bare-substrate pixel. In some implementations, 10% filtering may be deliberately small to allow for a relatively large amount of light to reach the pixels, while the spectrally variegated pixels allow for spectral diversity. For example, just under 10% filtering may be beneficial for special applications requiring extreme attention to light gathering and the MTF of an imager (at the cost of lower spectral diversity), while more than 10%, more than 15%, more than 25%, more than 35% or even more than 50% filtering may be beneficial (e.g., higher spectral diversity) for applications where signal to noise optimization within spectral dimensions of scenery (e.g., image subject matter) becomes a dominating design consideration (at the cost of light gathering efficiency). The degree of filtering can be different for differently-filtered pixels in a cell.

In addition to all nine pixels in pixel cell 302 having at least some form of mild spectral filtering, the pixel's respective spectral responsivities 304 may form a complete linearly independent set of responsivity functions. Accordingly, any linear combination of eight of these functions cannot exactly match or fit any given ninth pixel's spectral function.

Figure 4:
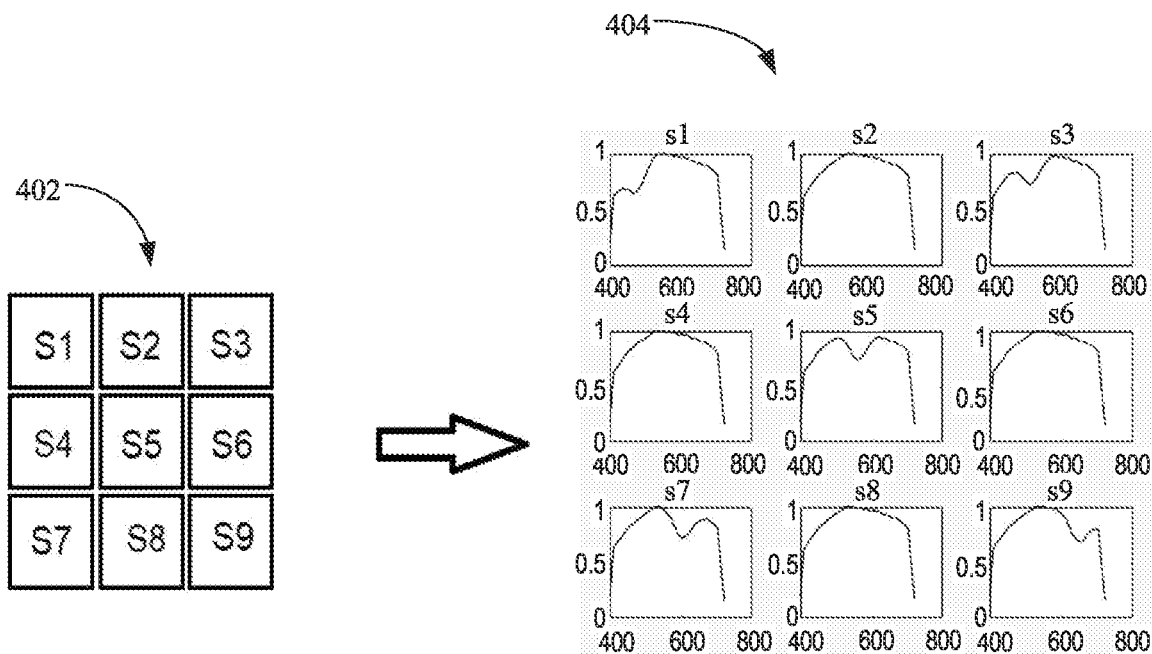
FIG. 4 schematically illustrates a 3×3 array of pixels of a pixel cell for an imaging device, and corresponding respective spectral responsivities, wherein several pixels are unfiltered, according to some embodiments.

FIG. 4 schematically illustrates a 3×3 array of pixels (e.g., pixel sensors) of a pixel cell 402 for an imaging device, and corresponding respective spectral responsivities 404, according to some embodiments. Pixel cell 402 is similar to pixel cell 302 except that four of the nine pixels are spectrally unfiltered (S2, S4, S6, and S8 have null filtering), and five (S1, S3, S5, S7, and S9) are spectrally filtered. In this case, there is a linear dependence of the pixels, generally equaling a 6-channel image sensor. Various other embodiments may involve design tuning of both linearly independent and linearly dependent pixel combinations.

In some implementations, such as those illustrated in FIGS. 3 and 4, classic polynomials (e.g., Legendre or Chebyshev polynomials) may closely fit empirically-defined spectral profiles of in-situ pixels. For example, five of the pixels of pixel cell 402 as shown in FIG. 4 have linear independence from each other, and each of the five have linear independence from the substrate profiles of pixels S2, S4, S6, and S8. Thus, there are six linearly independent pixels, where the grouping {S2, S4, S6, and S8} may represent a sixth dimension, giving a six-channel imaging sensor design.

Images captured by imaging sensors, such as ai-CMOS sensors or others, generally require demosaicing to be applied to raw data of the imaging sensors. Demosaicing may be used, for example, to produce a uniform color image output despite the fact that the raw data inputs from pixels have been 'mosaiced' by the individual pixels. Demosaicing a 3×3 pixel cell structured imaging device may be based on 9×9 linear kernel operations, as described below for some embodiments.

Figure 5:
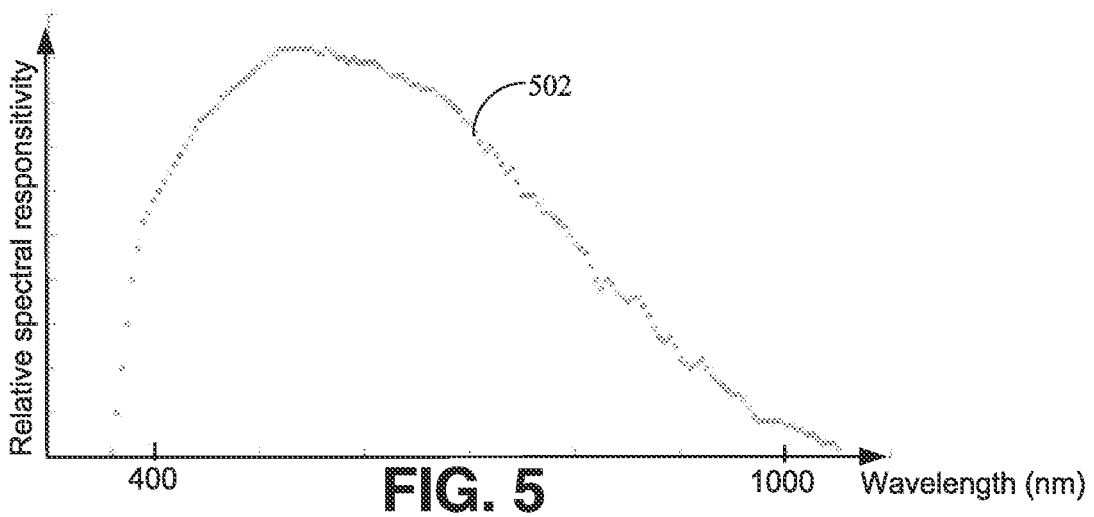
FIGS. 5-9 are spectral plots of relative spectral responsivity as a function of wavelength in the visible portion of the electromagnetic spectrum, according to some embodiments.

FIGS. 5-9 are spectral plots of relative spectral responsivity as a function of wavelength in the visible portion of the spectrum (though bordering portions of ultraviolet (UV) and infrared (IR) are also included in the spectral plots). FIG. 5 illustrates a spectral responsivity curve 502 of a particular CMOS image sensor. This curve represents a spectrally unfiltered (e.g., null filtering) base substrate response, in this case being that of silicon. All light available to this null-filtered image sensor may result in a maximum generation of photoelectrons N, and maximum MTF for a monochromatic image.

Figure 6:
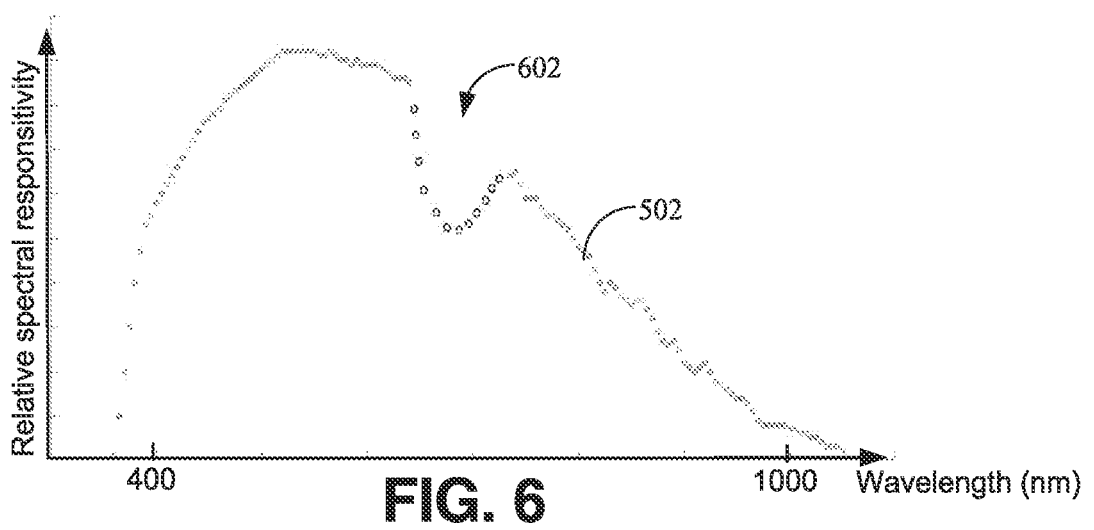

FIG. 6, on the other hand, illustrates spectral responsivity curve 502 of the particular CMOS image sensor (e.g., which is a baseline profile for the sensor) that includes a spectral 'notch' 602. Such a notch corresponds to a spectrally localized dip in responsivity of the image sensor. (For the avoidance of doubt, a diminishing tail of spectral response at the high or low end of the spectrum of interest, such as at the left and right ends of the spectral response curves 104 in FIG. 1, is not regarded as a notch.) Classic notch filters are optical filters that selectively reject a portion of the spectrum while transmitting most other wavelengths, and in their truly classic (and 2022-current) forms, notch filters usually extend all the way to zero responsivity across some appreciable range of wavelengths, such as 10 nanometers through 50 nm or even 100 nm. (One may note applicant is somewhat compelled to use the same word "notch" for the type of notch illustrated in FIG. 6. Other singular words for this slight subtraction of light may be 'bite', 'nibble', 'dip', 'subtraction', etc., all of which tend to illustrate the general ideas involved but tend to be colloquial as opposed to descriptive). For example, a notch filter that results in notch 602 rejects (by absorption or redirection) a portion of the overall intensity of light between about 640 nm and 740 nm. Accordingly, light available to this spectrally-filtered image sensor is less than the light that would otherwise be available in the absence of spectral filtering. Thus, the image sensor generates proportionally less than the maximum number of photoelectrons N in the absence of spectral filtering.

Relatively low concentrations of absorptive materials, designed for a particular wavelength range, may be used as spectral filters to produce spectral notch 602 or a spectral notch having similar characteristics (e.g., spectral width, responsivity diminution, etc.). Other techniques of spectral filtering may also be used, such as interference coatings (e.g., dielectric coatings), quantum dots, chemical dopants in a carrier material, dyes, pigment, and so on. In some implementations, a spectral notch may be characterized or described by the central wavelength of the notch (i.e., the wavelength of the local minimum), the width of the notch, and the depth of the notch relative to the baseline point of the substrate profile. Spectral notch 602 need not result from one notch filter alone and instead may result from more than one filter in series, or more than one active pigment/dye in a color resist.

The width of a notch is here defined as the width, e.g., in nanometers, between the wavelengths at which the spectral responsivity function has dropped to a point halfway between the unfiltered substrate responsivity at the notch wavelength, and the full depth of the notch. If the notch is of a character in which one side of the spectral response function does not recover to more than half the notch depth (as is the case with the right side of the curve of FIG. 6), then the width is taken to extend in that direction to the wavelength of the next local maxima on that side of the curve.

The depth of a notch is here defined as the fraction of the unfiltered substrate response function at the notch wavelength to which the spectral response curve dips at the notch minimum. Depth can be expressed as a fraction between 0 and 1.0, or as a percentage up to 100% (which corresponds to a spectral response function that drops to zero at the notch wavelength).

Figure 7:
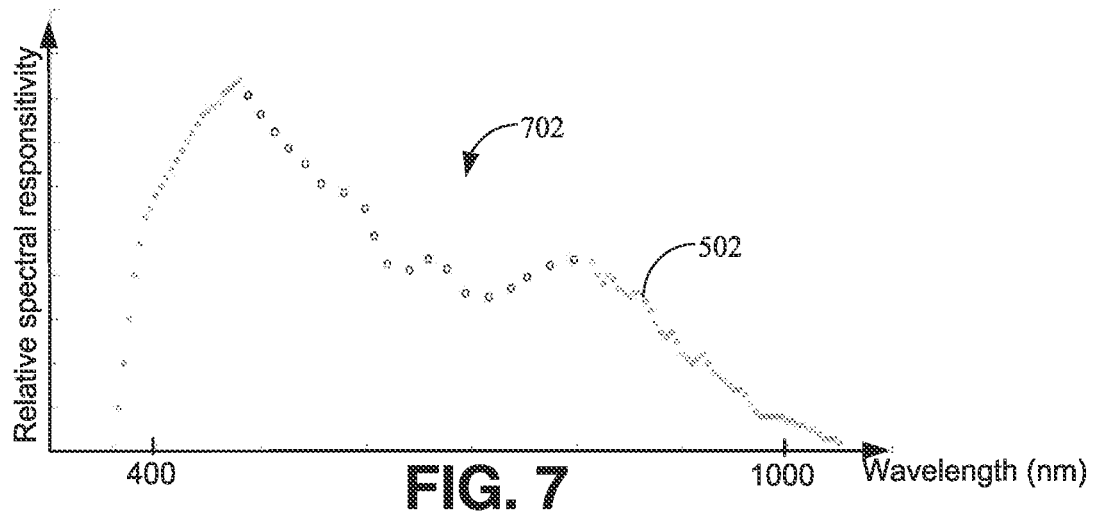

FIG. 7 illustrates spectral responsivity curve 502 (with null filtering) of the particular CMOS image sensor that includes a spectral notch 702. Compared to notch 602, notch 702 is spectrally broad and deep, and may result from a highly diluted band-rejection filter, which generally affects a broader range of wavelengths compared to a notch filter. For example, notch filters generally do not exceed 50 to 100 nanometers. For example, a band-rejection filter that results in notch 702 rejects (by absorption or redirection) a portion of the overall intensity of light between about 480 nm and 810 nm. Accordingly, light available to this spectrally-filtered image sensor is substantially less than the light that would otherwise be available in the absence of spectral filtering. Substantially less can be numerically described as 60% or more of the light is filtered, leaving 40% or less for photoelectron generation, for example. Thus, the image sensor generates substantially less than the maximum number of photoelectrons N in the absence of spectral filtering. Notch 702 includes two minima, at about 630 nm and at 710 nm. Spectral notch 702 need not result from one notch filter and instead may result from more than one filter in series.

Figure 8:
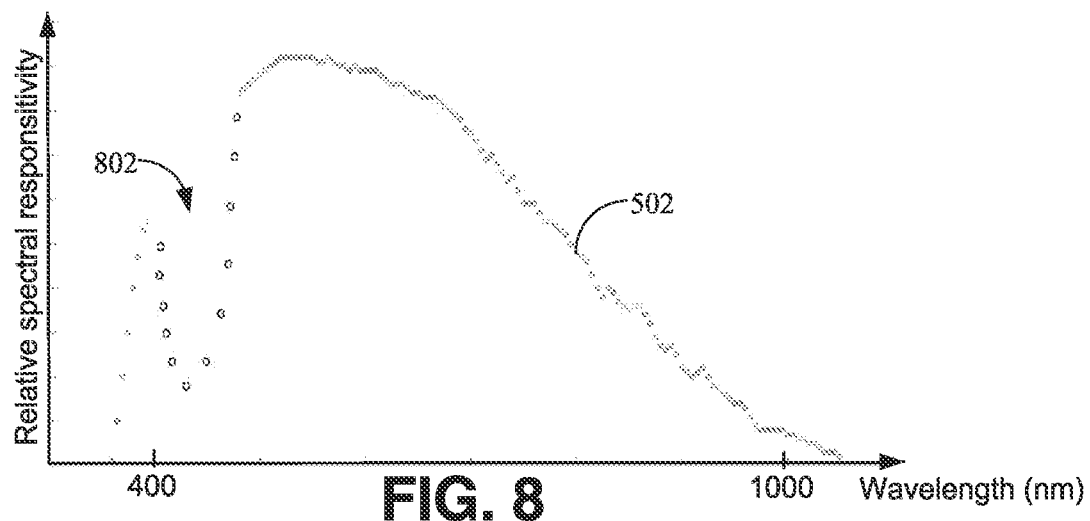

FIG. 8 illustrates spectral responsivity curve 502 of the particular CMOS image sensor that includes a spectral notch 802. Compared to notch 602, notch 802 is spectrally located at the shorter-wavelength part of the visible spectrum. For example, a notch filter that results in notch 802 rejects (by absorption or redirection) a portion of the overall intensity of light between about 400 nm and 480 nm. Accordingly, light available to this spectrally-filtered image sensor is less than the light that would otherwise be available in the absence of spectral filtering. Thus, the image sensor generates less than the maximum number of photoelectrons N in the absence of spectral filtering. Spectral notch 802 need not result from one notch filter and instead may result from more than one filter in series.

Figure 9:
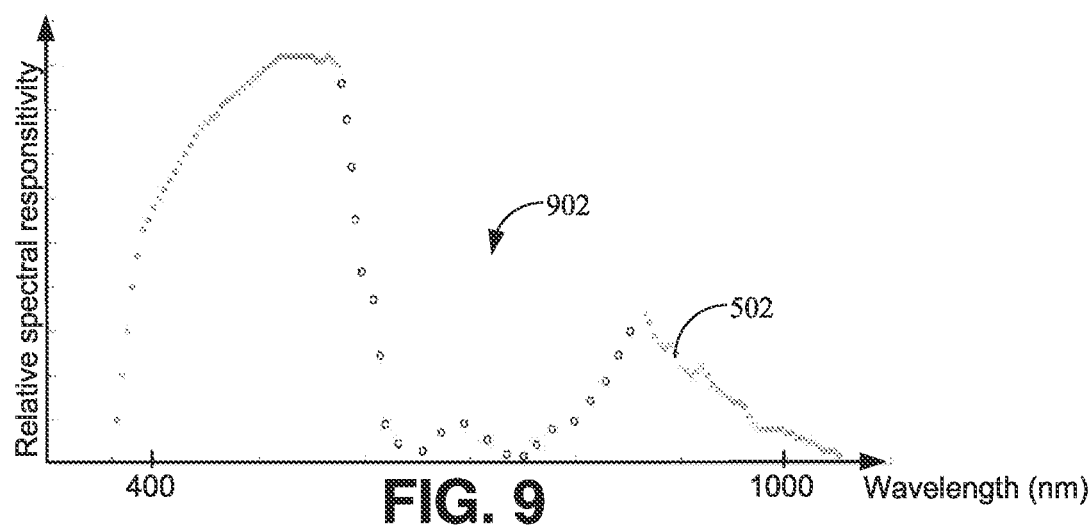

FIG. 9 illustrates spectral responsivity curve 502 of the particular CMOS image sensor that includes a spectral notch 902. Compared to notch 702, notch 902 is similarly spectrally broad but substantially deeper, and includes almost zero responsivity at two minima in the red portion of the visible spectrum, at about 650 nm and at 750 nm, respectively. Notch 902 may result from a band-rejection filter, which generally affects a broader range of wavelengths compared to a notch filter. Alternatively, notch 902 may result from two relatively narrowband notch filters in series (e.g., one filter behind another filter). For example, a spectral filter that results in notch 902 rejects (by absorption or redirection) a portion of the overall intensity of light between about 575 nm and 860 nm. Accordingly, light available to this spectrally-filtered image sensor is substantially less than the light that would otherwise be available in the absence of spectral filtering. Thus, the image sensor generates substantially less than the maximum number of photoelectrons N in the absence of spectral filtering. The collective idea behind presenting FIGS. 5 through 9 is that the core concept of subtracting from the innate, unfiltered substrate responsivity is a generalized concept subject essentially to only physically realizable spectral filtering approaches. If cost were no issue, one can conceive of any and all filtering shapes being applicable. Indeed, a quick look at common cellophane filter books, for example, finds many hundreds of dye and pigment choices for all colors within the slightly constrained full-color gamut.

Figure 10:
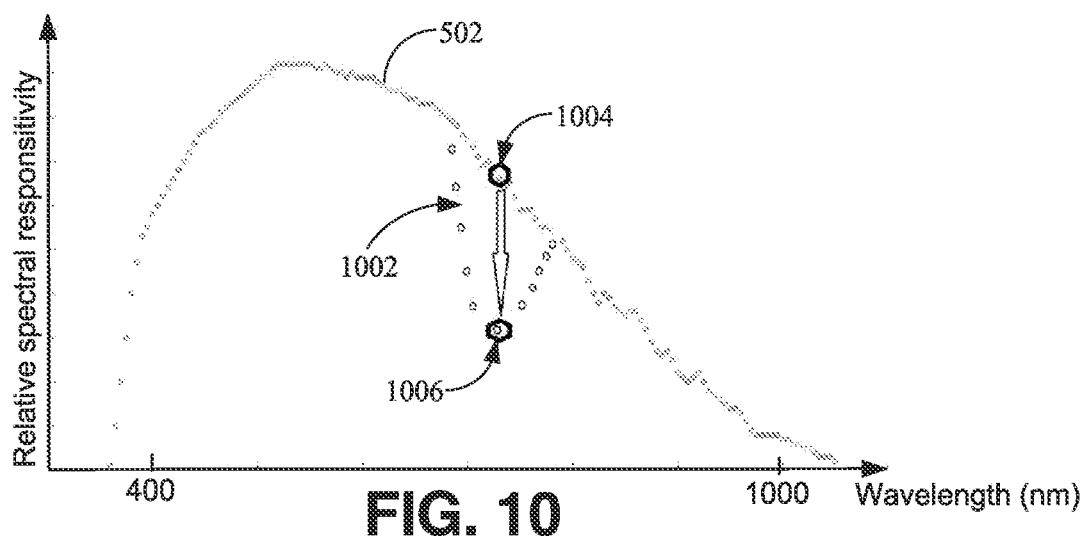
FIG. 10 illustrates a technique for defining a concentration level of a spectrally absorptive element, according to some embodiments.

FIG. 10 illustrates a technique for defining a concentration level of an absorptive element (e.g., a spectral notching filter), according to some embodiments. An example notch 1002 is superimposed on spectral responsivity curve 502. Absorptive elements (e.g., filters), such as physical mechanisms, pigments, and/or nanoparticles may have a signature subtractive spectral shape. One may define a concentration level of an absorptive element to be the amount of the absorptive element that lowers the spectral response of an image sensor substrate at a central wavelength to 50% of its unfiltered substrate value. In other words, the concentration of an ingredient may be gradually increased until a central wavelength (or wavelength range) drops to a 50% level of the unfiltered substrate responsivity. The concentration level at which that occurs may be called the 'C50' concentration level for that absorptive element. For example, in FIG. 10, the spectral responsivity at point 1004, along spectral responsivity curve 502, is without any absorptive filtering present. On the other hand, the spectral responsivity at point 1006, which coincides with the minimum of notch 1002, results from the presence of an absorptive element that decreases the spectral responsivity at a particular wavelength (or range) to 50% of the spectral responsivity at point 1004. Thus, the concentration level at which the spectral responsivity at point 1006 occurs may be defined as the 'C50' concentration level for that absorptive element. The Beer-Lambert law is the operative principle behind responsivity curves as shown in FIG. 10. Following the dictates of this law will allow a designer to have effectively continuous control of the dilution factors which will produce optimal profile results.

Figure 11:
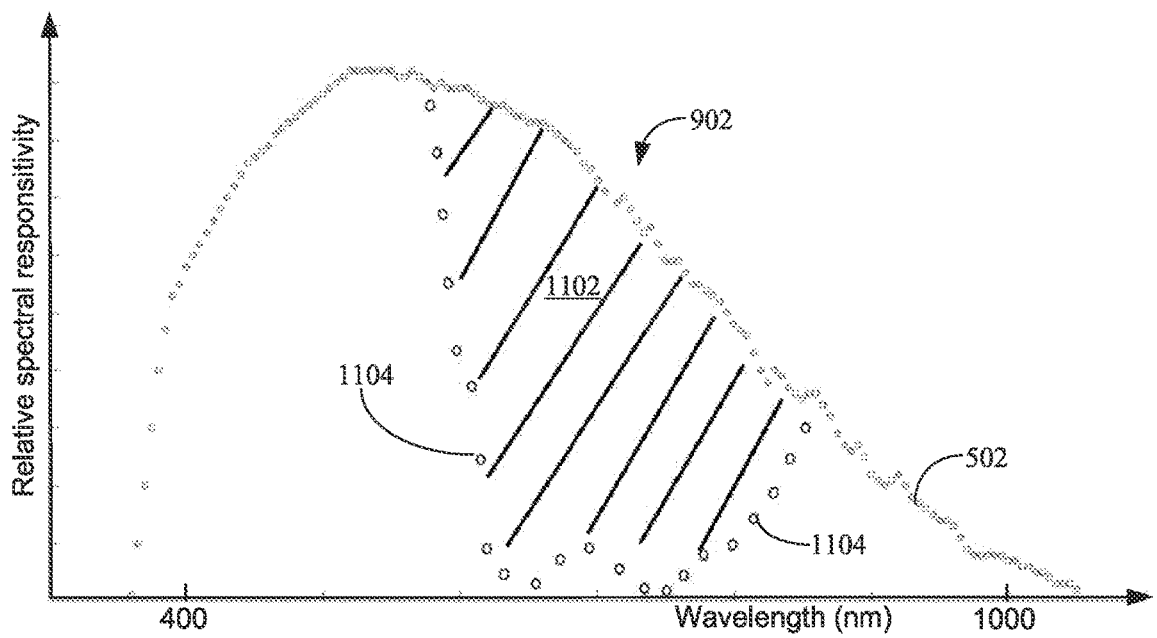
FIG. 11 illustrates photoelectron cost, being a measure of the lack of photoelectron signal generation otherwise possible, according to some embodiments.

FIG. 11 illustrates photoelectron "cost", according to some embodiments. The photoelectron cost may be an integrated area 1102 of spectral responsivity curve 502. This area, bounded by curve 502 and a lower boundary 1104 of notch 902, may represent non-sensed photons that would have otherwise been sensed if not for the presence of a spectral absorber that prevented these photons from reaching the image sensor. For example, such a spectral absorber, creating notch 902, results in about 40% of the otherwise available photoelectrons being unavailable (thus diminishing an associated photoelectron signal), but also creating spectral diversity, which may be a desirable tradeoff, as discussed herein.

Figure 12:
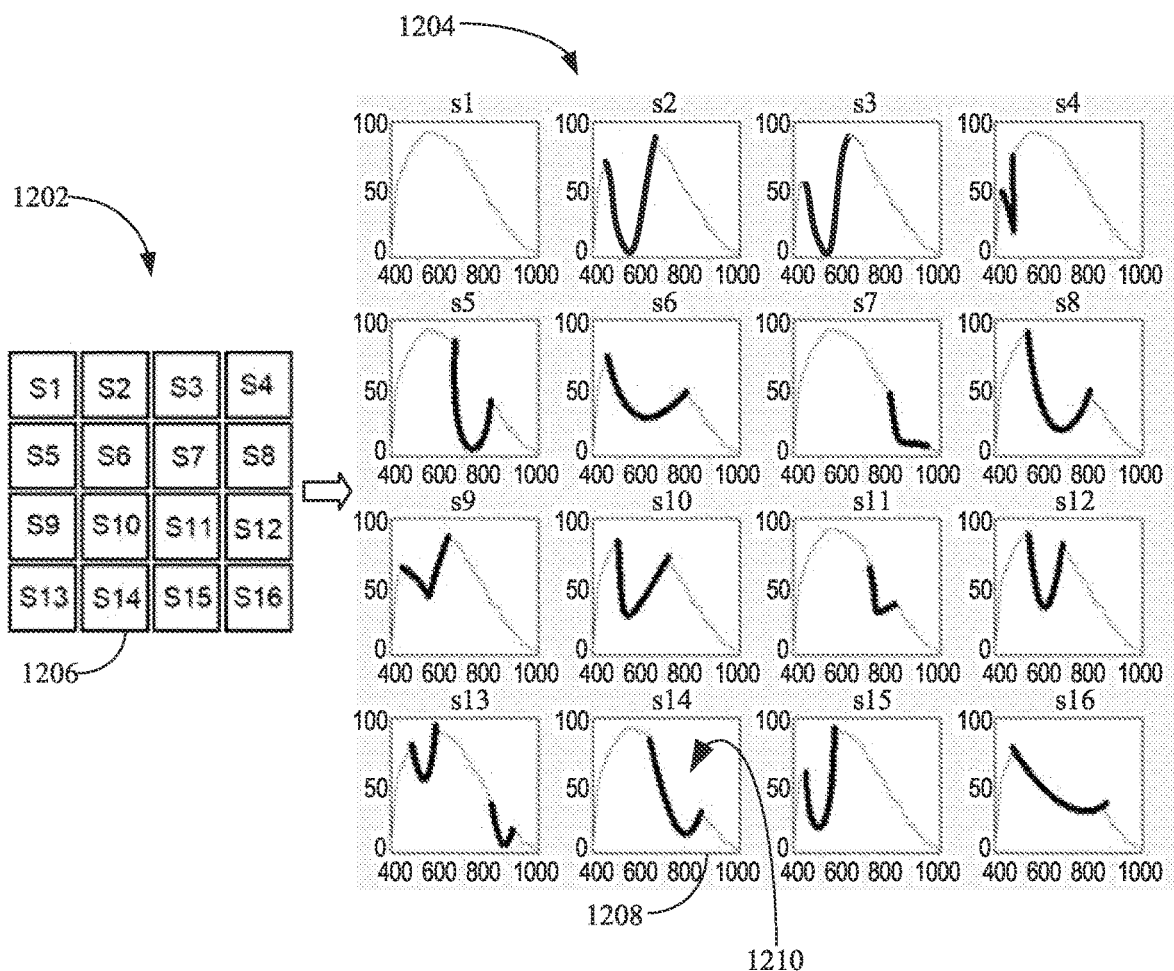
FIG. 12 illustrates a 4×4 array of pixels in a pixel cell for an imaging device and corresponding respective spectral responsivities, according to some embodiments.

FIG. 12 illustrates a 4×4 array of pixels, S1 to S16, in a pixel cell 1202 for an imaging device, and corresponding respective spectral responsivities 1204, according to some embodiments. Portions of the spectral responsivities, except for null-filtered pixel S1, include one or more curve portions, indicated by a relatively thick line, that coarsely and schematically represent differing spectral notch ensembles. The spectral responsivities 1204 are different for every pixel in this illustrated example by having spectral notches of different characteristics.

It is instructive to compare FIG. 12 to FIG. 1. In particular, the pixel cell 1202 includes 16 pixels, each having their own (generally) unique spectral responsivity profiles. Pixel cell 1202 may be tiled across a CMOS imaging device such that pixel cell 1202 repeats horizontally and vertically a number of times across the imaging device, depending on the size or resolution of the imaging device. For example, a 4×4 pixel cell may repeat horizontally across a 1024×768 imaging device 256 times and may repeat vertically across the imaging device 192 times. Each pixel cell is labelled S1, S2 . . . S16 for descriptive purposes. Spectral responsivities 1204 (e.g., silicon-substrate spectral responsivity functions that are typical of CMOS imaging sensors) are plotted as relative responsivity (e.g., 0 to 100%) as a function of wavelength, which ranges from about 400 to 1000 nm. In addition to spectral responsivities 1204 being generally different for different materials, different optical filtering elements (or lack thereof) may also lead to different spectral responsivities.

In particular, the 4×4 array of pixel cells 1202 includes individual cell members (e.g., 1206 and its corresponding spectral response 1208) that each have different spectral filtering, though in other examples, one or more pixel cells could have the same or similar spectral filtering. Thus, the "natural" spectral responsivity (e.g., of the semiconductor material of which the pixel cells is manufactured) may be modified by spectral filtering. Such modification leads to spectral responsivities that may be unique to each cell member (e.g., each pixel). Such modification may be produced by creating one or more spectral notches in the "natural" spectral responsivity of the substrate (e.g., silicon) of pixel cell 1202. For example, pixel cell member S14 (e.g., 1206) is subjected to spectral filtering that creates a notch 1210 in corresponding spectral response 1208. Accordingly, the "natural" spectral responsivity of the substrate and the spectral filtering that creates notch 1210 result in spectral response 1208.

Such a 16-set of pixel filtering schemes likely produces a spectral diversity that is desirable for AI-efficacy. However, this spectral filtering reduces (in the context of light energy throughput) photoelectron generation performance by not allowing all available light to impinge onto the pixel cells (e.g., by light absorption by the filter material or light reflection away from the pixel cells), whereas null filtering (e.g., S1, or as in the example illustrated in FIG. 1) would not block any of such available light.

FIGS. 13-16 are spectral plots of relative responsivity as a function of wavelength in the visible portion of the spectrum (though bordering portions of UV and IR are also included in the spectral plots). These figures collectively introduce the dot product to the above-described concepts and techniques, dot product being a preferred metric used for determining the similarity and differences between pixel filtering profiles. Smaller dot products connote larger differences, which increase AI-efficacy. Hence, a lower dot product can be an indirect measure for higher AI-efficacy. For example, the dot product can be used as an early design-phase proxy for AI-efficacy. Only in-situ testing of sensors within some given AI application will ultimately answer the quantified question behind AI-efficacy. The term 'spectral diversity' and 'maximizing spectral diversity' is used often as an English phrase intended to capture the underlying mathematical concepts in operations such as the dot product and its minimization. It should be noted that though the dot product is a superb singular metric which can help understand and quantify spectral diversity and its maximization, there are also many other mathematical quantification approaches which should be considered and used as well. Earlier incorporated-by-reference provisional filings, for example, taught how 'confusion matrices' and the relatively well-known ROC (Receiver Operator Curve) can be a measure for many types of 'diversity', including spectral diversity. Likewise, the summation of the absolute value of slopes of curves can be a quantitative proxy for spectral diversity, especially if there is an additional metric of 'slopes at different wavelengths' which accompanies those slopes. Thus a steep slope at 450 nm in one pixel might be shifted by 40 nm in a neighboring pixel. The idea here is that the dot product serves as an excellent example of quantifying spectral diversity, but there are many other metrics that can be utilized as well.

Figure 13:
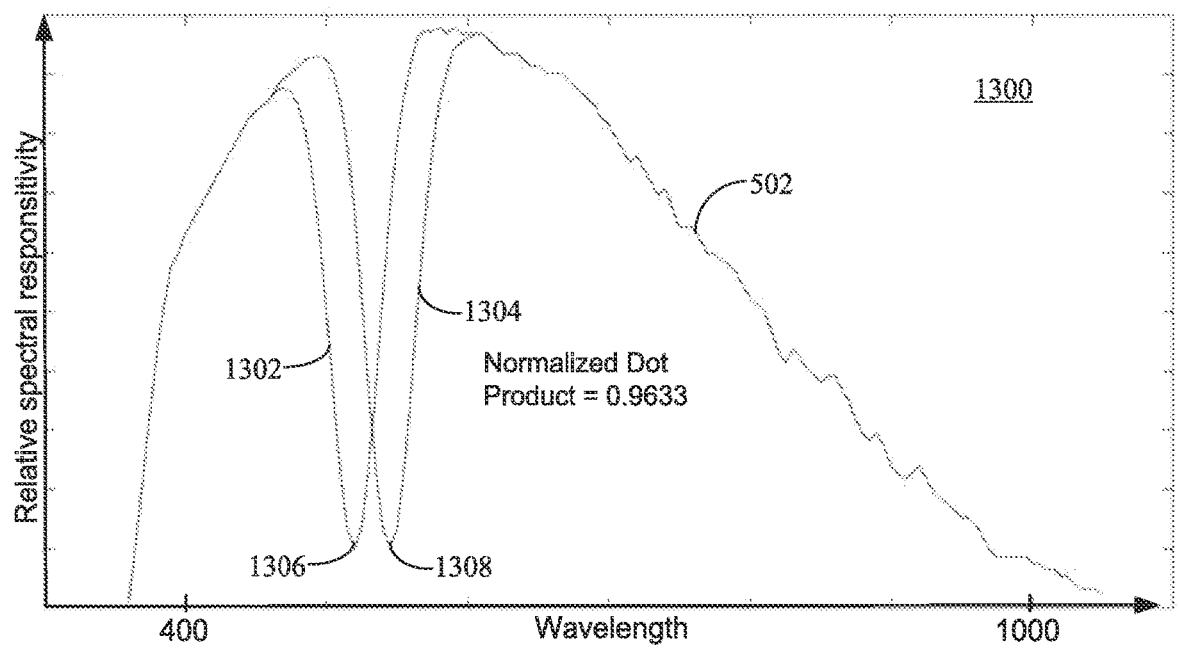
FIGS. 13-16 are spectral plots of relative spectral responsivity as a function of wavelength in the visible portion of the spectrum, and illustrations of establishing a metric of similarity and difference between two functions, according to other embodiments.

FIG. 13 illustrates, in a single graph 1300, two examples of spectral responsivity curves 1302 and 1304, which are spectral notches in null-filtering responsivity curve 502. Curve 1302 is a spectral notch having a minimum 1306 and curve 1304 is a spectral notch having a minimum 1308. These minima may be spectrally separated from each other by about 20 nm, for example. Beyond these notches, both spectral responsivity curves overlap and coincide with a null-filtering spectral responsivity curve that may be similar or the same as 502, at least in the spectral portions that don't include any portion of the notches.

In a particular example, a first pixel of an image sensor may have spectral responsivity curve 1302 and a second pixel may have spectral responsivity curve 1304. Both first and second pixels may be in a pixel cell, which may be repeated throughout the image sensor. For instance, the first pixel may be S3 of pixel cell 1202 and the second pixel may be S2 of pixel cell 1202. Differences between spectral responsivity curves 1302 and 1304 may lead to desired spectral diversity. In some embodiments, the spectral diversity of two spectral responsivity curves may be characterized or quantified using several techniques. For example, steeper slopes in spectral responsivity curves generally tend to allow for higher discriminations of spectral changes (e.g., of spectral responsivity and related parameters) over short stretches of the spectrum. In another example, the mathematical concept of orthogonality between curves or functions is a way to quantify spectral diversity. In some implementations, vector operations between entities (e.g., vectors or functions) can be a relatively strong predictor of informational value for an ML application. For instance, a normalized dot product between curves 1302 and 1304 may set forth a baseline level against which other normalized dot products can be compared. A higher normalized dot product may indicate more informational similarity, and less spectral diversity, between two different spectral responsivity curves. Conversely, a lower normalized dot product may indicate less informational similarity, and greater spectral diversity, between two different spectral responsivity curves. For a particular numerical example, the normalized dot product between curves 1302 and 1304 may be 0.9633 (calculated from spectral responsivity values at 5 nm increments from 360 nm to 1050 nm), which is less than one and indicates that the spectral notches of the two curves can provide separate but similar spectral information. This example value may be considered a 'baseline number' against which dot product values of other pairs of spectral responsivities may be compared. Mathematically, this example value is a relatively high dot product, indicating that the two spectral profiles are fairly close to each other since both profiles include similar notch filters (and roughly 80% of the spectral values of the two spectral curves are identical (e.g., their spectral values away from their respective notches)).

Figure 14:
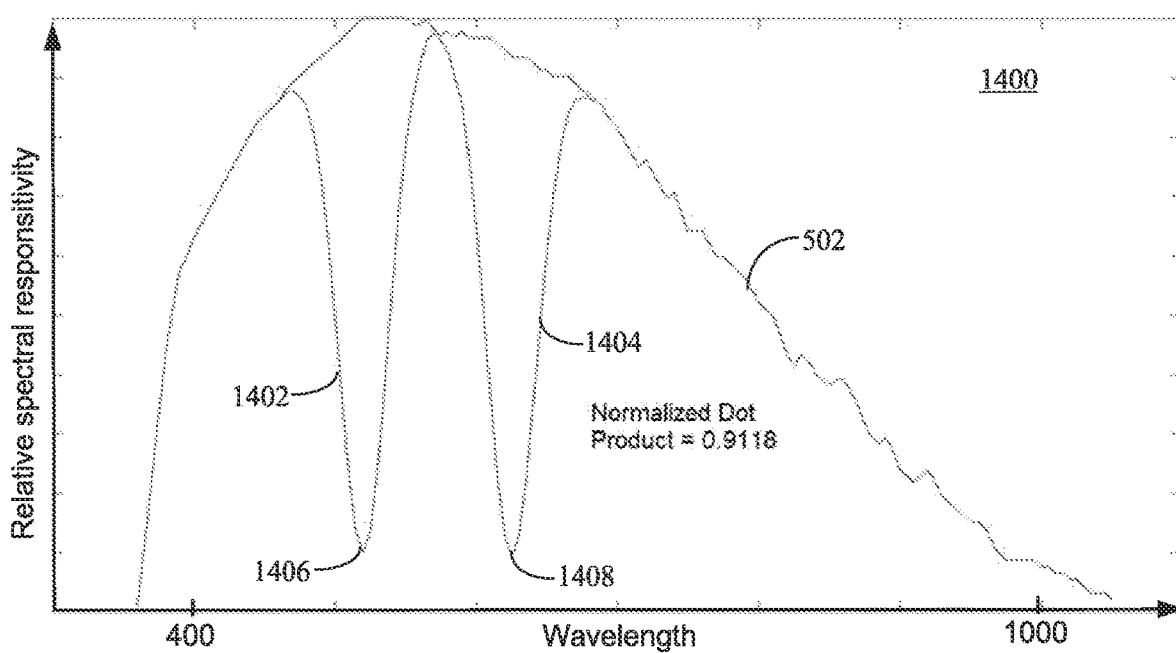

FIG. 14 illustrates, in a single graph 1400, two examples of a spectral responsivity curve 1402 and 1404, which are spectral notches in null-filtering responsivity curve 502. Curve 1402 is a spectral notch having a minimum 1406 and curve 1404 is a spectral notch having a minimum 1408. The two notches are separated from each other by a greater spectral distance (e.g., about 100 nm) compared to the notches in FIG. 13. Other than this increased separation, the shape of the notches and curves 1402 and 1404 are similar to those of 1302 and 1304. This greater separation generally leads to a lower-valued dot product. For a particular numerical example, and to compare with the curves in graph 1300, the normalized dot product between curves 1402 and 1404 may be 0.9118, which is lower than the dot product of 0.9633 as calculated above for the curves 1302 and 1304. This lower value indicates that the spectral notches of the two curves can provide spectral information that is more diverse compared to what curves 1302 and 1304 can provide.

Figure 15:
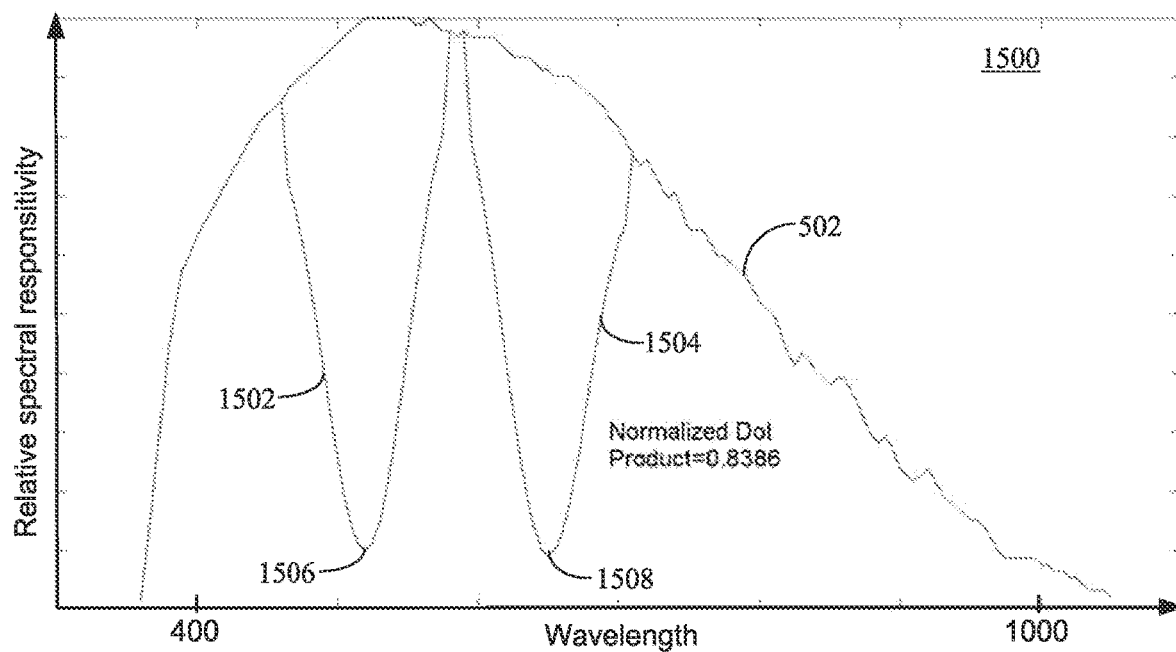

FIG. 15 illustrates, in a single graph 1500, two examples of a spectral responsivity curve 1502 and 1504, which are spectral notches in null-filtering responsivity curve 502. Curve 1502 is a spectral notch having a minimum 1506 and curve 1504 is a spectral notch having a minimum 1508. The two notches are separated from each other by a greater spectral distance (e.g., about 140 nm) compared to the notches in FIG. 14. Also, each of the notches are spectrally wider compared to the notches in FIG. 14. Other than the increased separation and broader notches, the shape of the notches and curves 1502 and 1504 are similar to those of 1402 and 1404. The greater separation generally leads to a lower-valued dot product. For a particular numerical example, and to compare with the curves in graph 1400, the normalized dot product between curves 1502 and 1504 may be 0.8386, which is lower than the dot product 0.9118 as calculated above for the curves 1402 and 1404. This lower value indicates that the spectral notches of the two curves can provide spectral information that is more diverse compared to what curves 1402 and 1404 can provide.

The lower dot product numbers are generally indicating that any pair of spectral curves that have a lower normalized dot product may allow for higher AI Efficacies as compared to a different pair of spectral curves that results in a higher normalized dot product.

Another measure by which spectral response profiles can be described is the steepness of their notch "skirts." Referring to FIG. 10, the depth of the illustrated notch is the difference between the responsivities at points 1004 and 1006, as a fraction of the difference between the responsivity at point 1004 and zero. By way of example, assume this notch has a depth of 52%. The skirt steepness indicates the difference in wavelengths over which the middle half of this drop occurs. That is, the steepness is the difference in wavelengths over which the responsivity drop extends from 13% to 39%. Only the left side of the curve in FIG. 10 traverses this range; the right side of the curve barely reaches back to the middle of the notch depth (e.g., 26%). The left side drops over this middle half of the notch depth over a span of 9 nanometers in this example.

If both sides of the notch curve traverse this range (e.g., from 25% of the notch depth of 52%, to 75% of the notch depth), then the metric derived from the steeper of the two sides is used to characterize the skirt steepness of the notch. If a single spectral response profile has several notches, the metric derived from the steepest of the various notch slopes is used. In the FIG. 10 example, we characterize the spectral response curve as having a skirt steepness of 9 nanometers.

From the foregoing it will be seen that spectral response profiles can be characterized and compared to each other by various metrics. One is the pair-wise dot product arrangement just discussed (and its alternatives, such as mutual orthogonality and vector metrics). Another is the skirt steepness of the profile. Another is whether a spectral response curve has a single notch, or multiple notches. (A notch here refers to the situation in which a spectral response curve includes a local minimum having a depth exceeding 5% of the unfiltered substrate responsivity at that wavelength). Another is a pixel's photon sensitivity relative to null-filtering (commonly expressed as a percentage, over a spectrum of interest—such as 400-1000 nm. Others metrics, detailed earlier, include the central wavelength of the notch, the width of the notch, and the depth of the notch relative to the baseline point of the substrate profile (e.g., as a fraction of the unfiltered substrate responsivity at the notch wavelength).

Spectral response functions of first and second pixels in a common cell are said to be substantially different if they differ in any of the following ways:

(a) The skirt steepness of the first pixel's spectral response function is 15% or more greater than the skirt steepness of the second pixel's spectral response function;

(b) The spectral response function of the first pixel has a single notch of depth>5%, and the spectral response function of the second pixel has two or more notches of depth>5%;

(c) The wavelengths of notches in the first and second pixel spectral response functions differ by 5 nm or more.

(d) The width of a deepest notch in the first pixel spectral response function is more than 10% different than the width of a deepest notch in the second pixel spectral response function;

(e) The depth of a deepest notch in the first pixel spectral response function is more than 5% different than the depth of a deepest notch in the second pixel spectral response function;

(f) The normalized cross-correlation of their two spectral response functions over a spectrum of interest (e.g., 400-700 nm) is less than 0.9.

Two spectral response functions that are different, but are not substantially different as just-defined, may be regarded as being slightly different.

Within a first exemplary cell of pixels in an embodiment, there may be a pair of pixels having different spectral response profiles that have a normalized cross-correlation (over the range of 400-700 nm) greater than 0.9, and a pair of pixels having spectral response profiles that have a normalized cross-correlation (over that range) of less than 0.7.

In this first cell, the spectral response profile of one pixel may have a notch width of 40 nm or less, and another pixel may have a notch width of 100 nm or more.

Additionally or alternatively, in this first cell, the skirt steepness of one pixel's spectral response notch may be less than 10 nm, while that of another pixel's spectral response notch may be greater than 25 nm.

Additionally or alternatively, in this first cell, the width of the deepest notch in one pixel's spectral response function may be less than 15 nm, while that of another pixel's spectral response function may be greater than 50 nm.

Additionally or alternatively, in this first cell, the depth of the deepest notch in one pixel's spectral response function may be more than 40%, while the deepest notch in another pixel's spectral response function may be in the range of 5-20%

Additionally or alternatively, in this first cell, one pixel's spectral response function may include only one notch having a depth of 10% to 90%, while another pixel's spectral response function may include two or more notches having depths of 10-90%.

Additionally or alternatively, the pixels in this first cell can average more than 60% photon sensitivity relative to null-filtering.

Additionally or alternatively, a pixel in this first cell may include a notch of at least 10% depth at a wavelength below 350 nm, and/or a pixel in this first cell may include a notch of at least 10% depth at a wavelength above 1050 nm.

Additionally or alternatively, this first cell can comprise 9 or 16 pixels.

Additionally or alternatively, this first cell can include one or more pixels that are null-filtered.

Additionally or alternatively, this first cell can include two pixels whose spectral response profiles yield a normalized cross-correlation (over 400-700 nm) of between 0.8 and 0.9;

Additionally or alternatively, this first cell can include two pixels whose spectral response profiles yield a normalized cross-correlation (over 400-700 nm) of less than 0.6.

Figure 16:
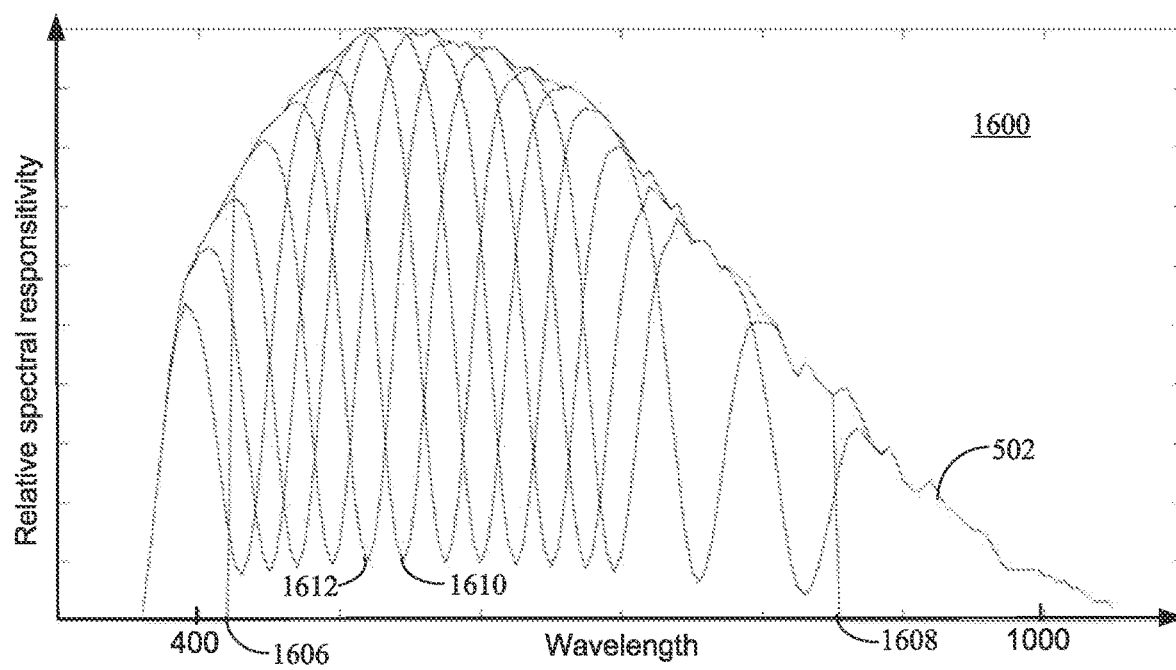

FIG. 16 illustrates, in a single graph 1600, sixteen example spectral responsivity curves, each with respective spectral notches in null-filtering responsivity curve 502. Graph 1600 includes a UV cut-off 1606 at about 420 nm and an IR cut-off 1608 at about 850 nm. These spectral curves may be applied to an MSI-type CMOS (or other type of) image sensor. The outer (upper) bounding shape of graph 1600 corresponds to the (null-filtering) silicon substrate response 502, shown in previous figure as well. All sixteen pixel responses are represented in graph 1600, where fourteen of the sensors can be seen as notch depressions (e.g., minima) such as 1610 and 1612. Two spectral cut-off pixels are represented by vertical lines at 1606 and 1608. One may posit notching arrangements where the classic RGB bandpasses of Bayer become the result, or the pseudo-inversion of RGB in the lesser known (but still practiced) Cyan, Magenta, Yellow spectral profiles. The point made here is that generalization, taken to its extreme, encompasses any form of spectral filtering. It is the relaxation of the requirement for ordered filtering arrangements that lies behind the logic of, for example, FIGS. 6 through 15. The acronym TuLIPs is intended to best capture this design-worthy freedom: Tuned Linearly Independent Polynomials. In lay terms, a process may be to pick an arbitrary filter profile then select the next chosen filter profile such that the second filter profile reasonably different from the first filter profile. This process may then be repeated across a selected spectral range.

As described below, a 4×4 input set of pixel data from a 4×4 pixel cell of sixteen pixels may produce a 12×12 output set of panchromatic image solution values corresponding to each indexed pixel. Thus, each indexed pixel S1 through S16 has its own unique set of 144 output values associated with it. All sixteen sets of 144 output values may be combined into a 144 row by 16 column (144×16) matrix, called the panchromatic solution matrix.

Figure 17:
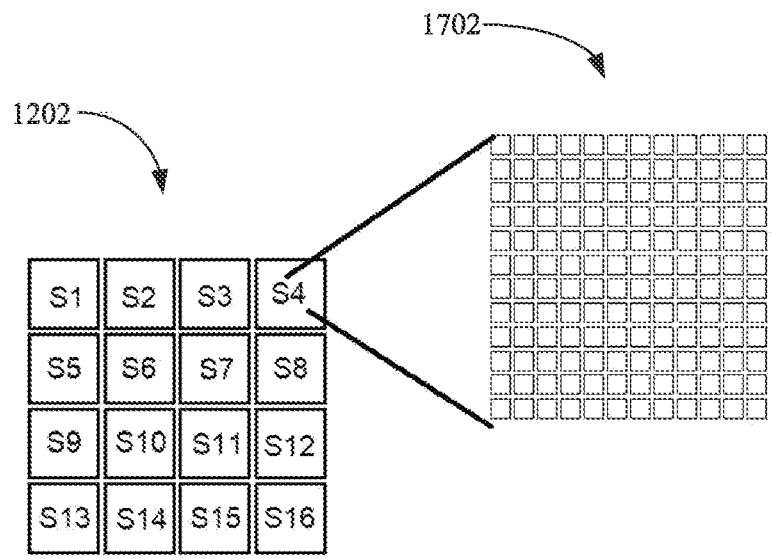
FIG. 17 illustrates one of sixteen indexed pixels projecting a 12×12 array of data values into a P-channel solution space, according to some embodiments.

FIG. 17 illustrates one of the 16 indexed pixels, S4, of 4×4 pixel cell 1202 (from FIG. 12) projecting a 12×12 array 1702 of data values into a P-channel solution space. Capital P in this instance here stands for panchromatic. This is a single valued image, also known as a greyscale image. There are actually many names that are applied to the general idea of a single-valued image, another common term being luminance. Luminance in this context is reasonable but not exact, since the well-accepted term luminance usually refers specifically to the so-called "photopic" light responsivity function of the human eye. In our context here of FIG. 17, this is too narrow of a definition. Such a 12×12 array is a P-channel 12×12 projection kernel that may be associated with each and every pixel S1 through S16. In a convolution operation, underlying kernel values associated with pixel S4 may then be multiplied by the actual datum-value that pixel S4 receives during an image exposure. Each of the pixels S1 through S16 may project to such 12×12 P-channel solution values. The above description, and embodiments described below, may involve an arithmetic or linear algebraic approach to constructing a panchromatic image solution at a native resolution of the physical pixel cells.

Figure 18:
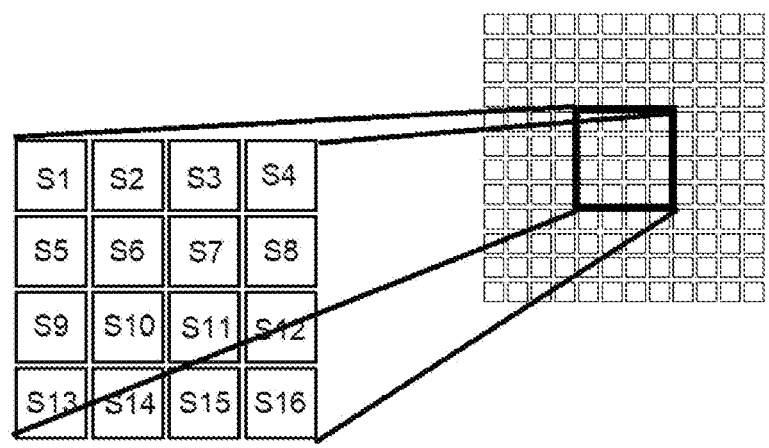
FIG. 18 illustrates all 16 pixels of a cell projecting values into an output P-channel solution space, according to some embodiments.

FIG. 18 graphically depicts each of the 16 pixels of 4×4 pixel cell 1202 projecting values into output P-channels, in this case being a 12×12 array of output values. Thus the projected forward S1 through S16 are all contribution to the background 12×12 output array. These output values are so-called accumulators, which accept and add up the values of their contributors. In a type of stuttering convolution, the S1 through S16 pixel cell (a core cell) is then stepped and repeated across an entire imaging sensor, wherein all 4×4 pixel cells contribute to their assigned 12×12 output P-channels. As with convolutions generally, there may be effectively trivial conditions at the edge of the imaging sensor (e.g., degenerate pixels) that do not have contributions from non-existing cells past the edges of the imaging sensor.

Demosaicing of GPR functions-based Raw Data (Generalized Pixel Response)

Figure 19:
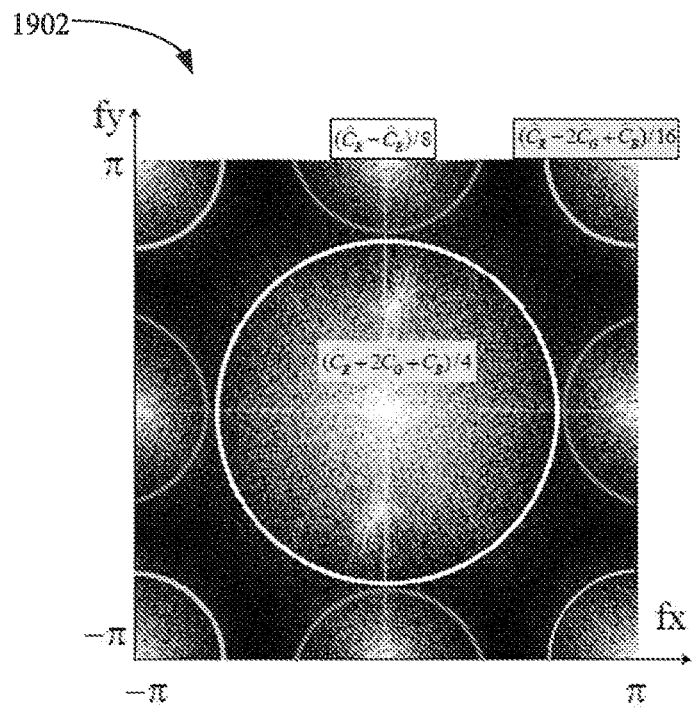
FIG. 19 illustrates a Fourier representation of a one-color per pixel image, according to some embodiments.

FIG. 19 illustrates a Fourier representation 1902 of a one-color per pixel image, according to some embodiments. This figure was reproduced from the paper 'Color demosaicing by estimating luminance and opponent chromatic signals in the Fourier domain,' by Alleysson et. al. (Color and Imaging Conference 2002 Jan 1, Vol. 2002, No. 1, pp. 331-336, Society for Imaging Science and Technology), the content of which is herein incorporated by reference. This splitting up of a monochromatic (a.k.a. black-and-white, greyscale, luminance, radiance, etc.) solution from a spectral solution will be employed in some embodiments. There are indeed single-stage demosaicing algorithms available to practitioners, but applicant has found superior end results using more than one stage of processing). Spatial chromatic features are generally broader and of lower spatial frequency than those of luminance features. Mathematically, color is generally sparser than luminance. Color information conveyed by raw data of a CFA having a pixel cell-repetitive structure, such as the Bayer filter, exhibits relatively unusual properties in the Fourier domain. Fourier representation 1902 is an example of a modulus of a fast Fourier transform (FFT) of a one-color per pixel image. There are nine regions where energy is concentrated. These regions correspond to luminance and opponent chromatic signals, arranged as illustrated in the figure. The frequency localization of luminance and opponent chromatic signals in the Fourier domain allows for estimating them by selecting corresponding frequency domains.

Luminance may be estimated by low-pass filtering, while chrominance may be estimated by high-pass filtering. These general points may be followed in embodiments regarding non-linear processing, described below. In such embodiments, non-linear approaches, some of which may be followed by linear correction approaches, may be used.

Figure 20:
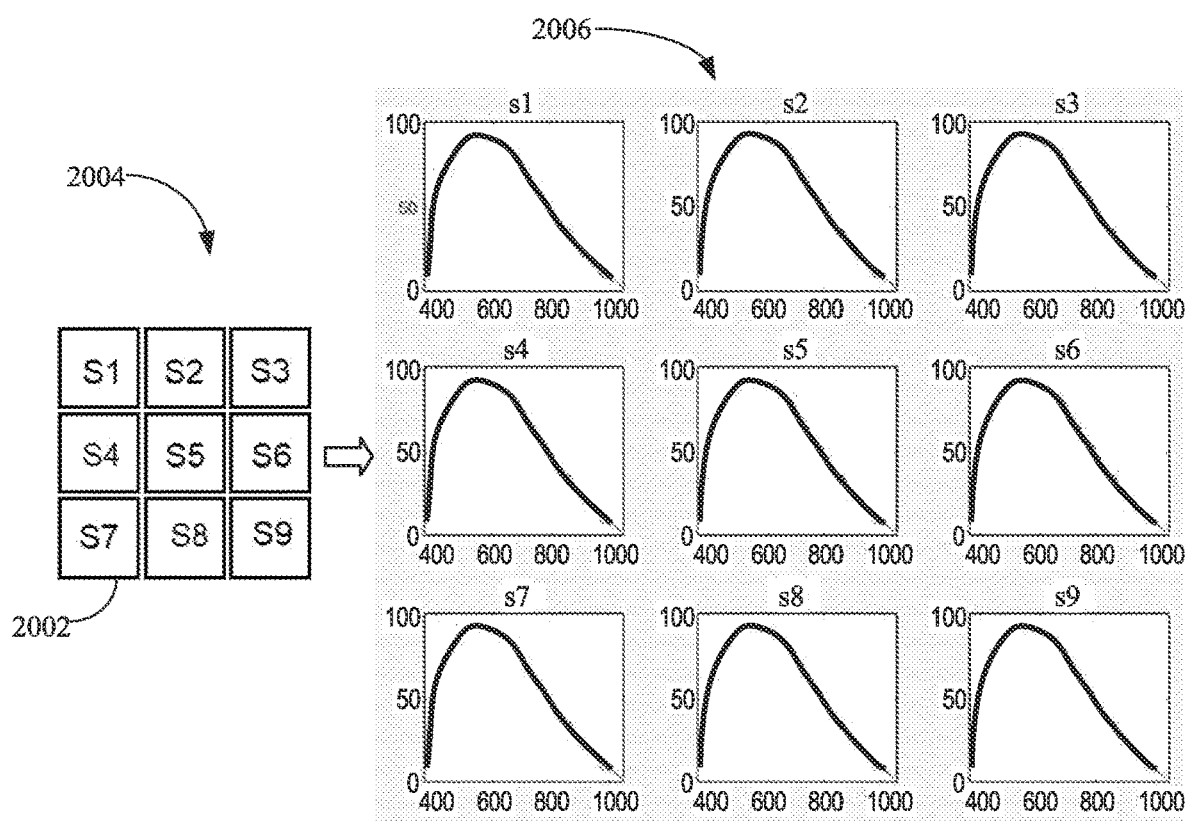
FIG. 20 illustrates a 3×3 array of pixels in a pixel cell for an imaging device and corresponding respective spectral responsivities for the pixels that have no spectral filtering applied, according to some embodiments.

FIG. 20 illustrates a 3×3 array of pixels 2002 in a pixel cell 2004 for an imaging device and corresponding respective spectral responsivities 2006, according to some embodiments. Pixel cell 2004 may be tiled across a CMOS imaging device, for example, in a repetitive manner such that pixel cell 2004 repeats horizontally and vertically a number of times across the imaging device, depending on the size or resolution of the imaging device. For example, a 3×3 pixel cell may repeat horizontally across a 1024×768 imaging device about 340 times and may repeat vertically across the imaging device 256 times. Each pixel cell is labelled S1, S2 . . . S9 for descriptive purposes. Spectral responsivities 2006 (e.g., silicon-substrate spectral responsivity functions that are typical of CMOS imaging sensors) are plotted as relative responsivity (e.g., 0 to 100%) as a function of wavelength, which ranges from 400 to 1000 nanometers (nm). Spectral responsivities 2006 may be different for different materials (e.g., silicon versus doped silicon versus germanium, etc.). Note the similarities between FIG. 20 and FIG. 1, which are different in that pixel cell 2004 is a 3×3 array of pixels whereas pixel cell 102 is a 4×4 array of pixels. Thus, in this embodiment, for the sake of example, the earlier described embodiment of 4×4 cells is reduced to a fundamental cell of a 3×3 cell, which will be used in the following non-linear demosaicing descriptions. The nine initial spectral profiles depicted in 2006 are identical to the substrate silicon spectral response (function) for null-filtered pixels. Careful examination of FIG. 20 will find that a lower order polynomial function has been 'fit' to the somewhat choppier empirically measured curves published by CMOS imager manufacturers. Such polynomial approximations assist in analytic optimizations that exercise a multitude of TuLIPS variations.

Figure 21:
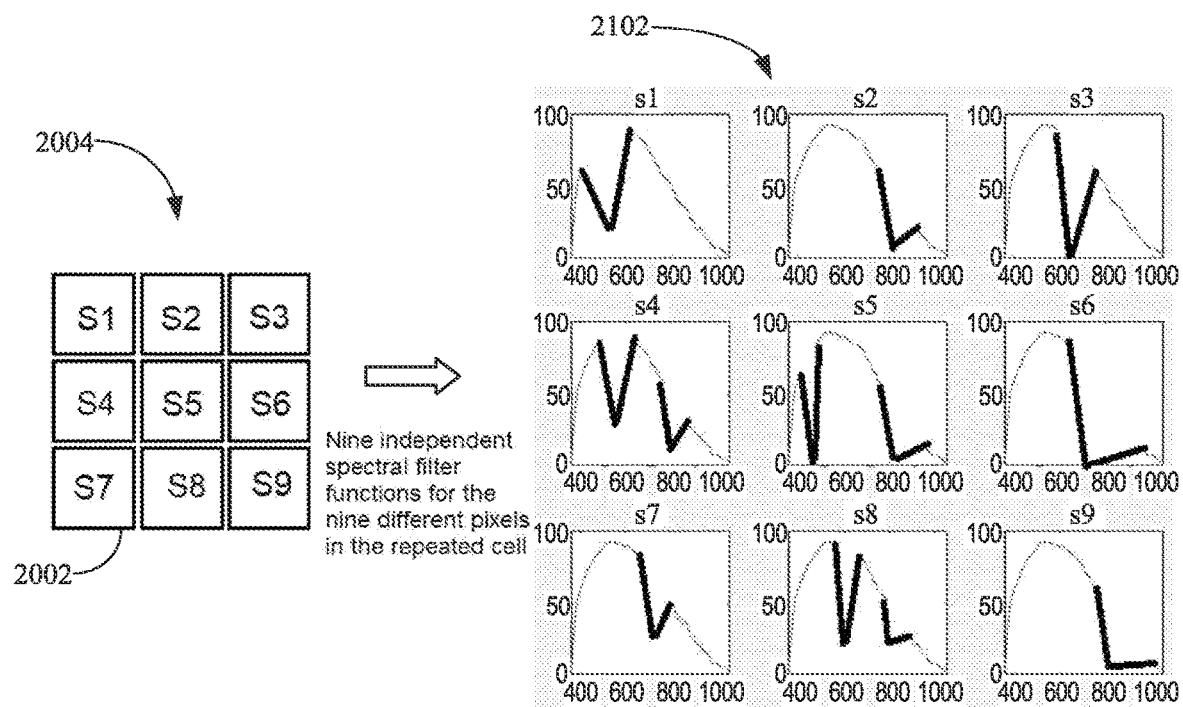
FIG. 21 illustrates a 3×3 array of pixels in a pixel cell for an imaging device and corresponding respective spectral responsivities that include one or more spectral subtractions of energy over certain ranges of wavelengths, according to some embodiments.

FIG. 21 illustrates 3×3 array of pixels 2002 in pixel cell 2004 for an imaging device and corresponding respective spectral responsivities 2102 resulting from the application of spectral notch filtering, according to some embodiments. Prescribed spectral filtering, such as notch filtering, may be applied to some or all of nine pixels 2002 in cell 2004. Portions of the spectral responsivities include one or more curve portions, indicated by a relatively thick line, that schematically represent spectral notches. The spectral responsivities 2102 are different for every pixel in this illustrated example by having spectral notches of different characteristics. FIG. 21 is intended to convey the general idea of 'arbitrary independence' of the spectral filtering functions in that no pixel filtering profile is exactly like any of the other eight, though claimed subject matter is not so limited to this specific example.

Figure 22:
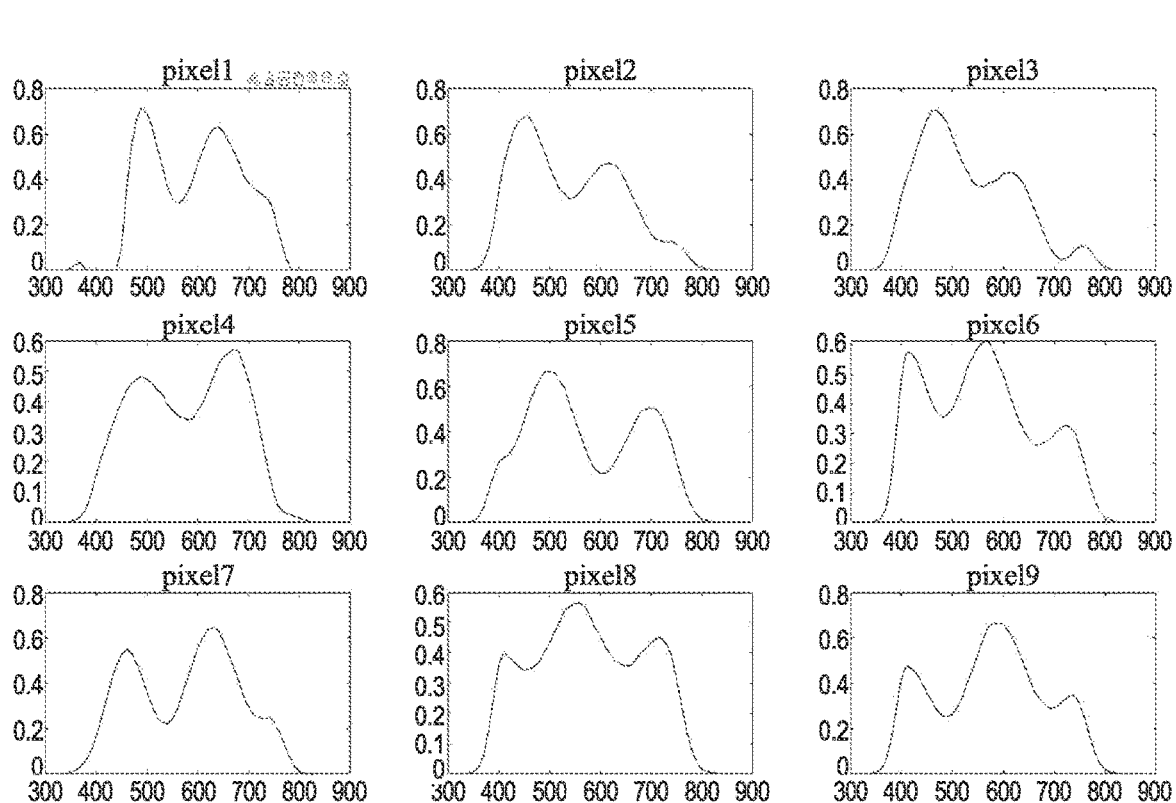
FIG. 22 illustrates another example of spectral responsivities, resulting from the application of spectral filtering of pixels, having relatively smooth characteristic spectral subtractions over various ranges of wavelengths, according to other embodiments.

FIG. 22 illustrates another example of spectral responsivities 2202 resulting from the application of spectral filtering of pixels 2002, according to other embodiments. Compared to the schematic representation of spectral responsivities 2102, which may result predominantly from notch filtering, spectral responsivities 2202 may result from spectral filtering other than notch filtering, and local minima remain well above zero (e.g., no spectral dip to near zero). Sets of different spectral profiles for different pixel cells generally lead to different results for the different pixel cells, but the common theme continues to be that pixels of a pixel cell having spectral profiles that are different from one another leads to spectral diversity, among other things. Thus, just as the case for 2102, the spectral responsivities 2202 are different for every pixel by having spectral profiles of different characteristics. FIG. 22 is intended to convey the general idea of arbitrary independence of the spectral filtering functions in that no pixel filtering profile is exactly like any of the other eight, though claimed subject matter is not so limited to this specific example. Indeed, FIG. 22 is the closest example yet in this disclosure to the preferred embodiment for the first generation of artificial intelligence tuned CMOS sensors: overall band-limited from 350 nm to 800 nm; a 3×3 cell; generally above 60% sensitivity relative to null-filtering, as a 3 by 3 ensemble; attention to the details of slopes within the critical zones of the X, Y and Z profiles of the CIE colorimetric system; for AI purposes, the average dot product between profiles is in the range of 0.87 to 0.93; and these are amenable to current inventory dyes and pigments available from color-resist suppliers, where some attention is required for dilution of widely available dye/pigment formulae.

Figure 23:
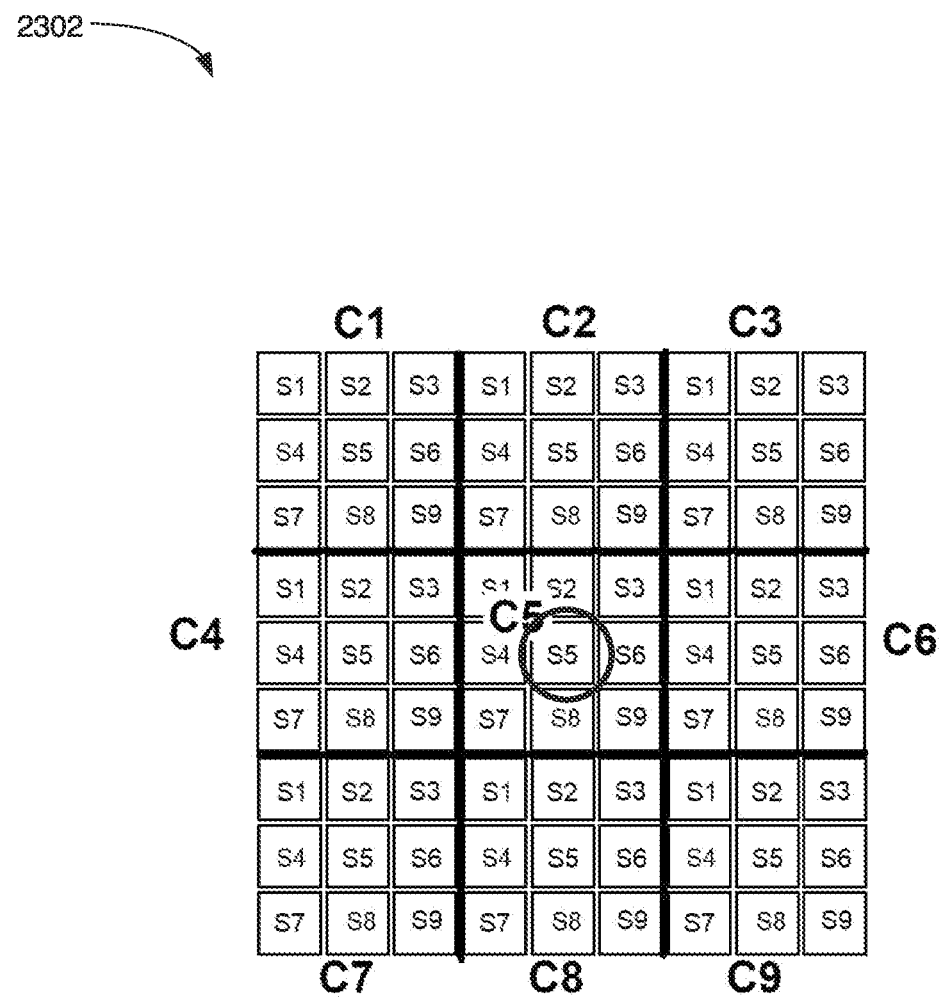

FIG. 23 illustrates a 9×9 "super-cell" 2302 of 3×3 repeated arrays of pixels, according to some embodiments. Super-cell 2302 includes a pixel cell that is repeated a number of times. For example, a pixel cell C1 is repeated horizontally as C2 and C3. Pixel cell C1 is also repeated vertically as C4 and C7, each of which are respectively repeated vertically as C5, C6, and C8, C9. FIG. 23 illustrates a first step, in various implementations, in a non-linear approach to demosaicing raw (e.g., unprocessed light intensity measurement) digital output values of a GPR functions-based sensor. An image may be created that includes a P-channel solution (e.g., a panchromatic, non-negative solution) with a resolution corresponding to the physical pixels, and three spectral opponent-process S-channels: RG, YB and VNIR (R: red, G: green, Y: yellow, B: blue, V: violet, NIR: near-infrared), all of which may also be processed toward the full resolution of the physical pixels. The three spectral opponent-process S-channels may, in some cases, possess inherently lower spatial frequency content, generally in line with classic notions of higher chromatic sparsity.

A singular output image value, in particular the so-named meanTuLIP or monochromatic or P-channel solution, may be determined by a 9×9 grid of raw numerical values measured by each of eighty-one pixels, for example. Any given P-channel output value, and then in a second stage, any given S-channel output value, may be a function of eighty-one raw digital values measured by a GPR functions-based sensor. As illustrated in FIG. 23, for this particular embodiment, a dependency, or functional relationship, may be established between a particular 'center' pixel, in this case the pixel (circled in the figure) indexed by S5 within the C5 supercell (designated S5-C5), and the eighty pixels surrounding that center pixel. The P-solution and the S-solutions for this pixel may all be functions of this entire group of eighty-one pixels. S-solutions are a short way of referring to entities such as the common red-green channel and yellow-blue channel of the LAB color space; We use the capital letter S to stand in for "Spectral", where this also can refer to classic "Chromatic" channels as well. Spectral is the more general term. The remainder of this discussion surrounding FIG. 23 is specifically aimed as lower light and higher noise image processing approaches which utilize non-linear processing methods in order to boost both MTF and color fidelity metrics as light levels decrease.

In some embodiments, an initial processing step for the specific pixel S5-C5 may be to perform a total-set gradient operation on all eighty pixels surrounding S5-C5 (the center pixel can have a zero multiplier during this gradient operation). Coarse horizontal and vertical gradients may be processed on the 9×9 array of the measured numerical values from each of the pixels. For example, the vertical gradient matrix may be the following, called VgradMatrix:

| | | | | | | | | |
|---|---|---|---|---|---|---|---|---|
| 4 | 4 | 4 | 4 | 4 | 4 | 4 | 4 | 4 |
| 3 | 3 | 3 | 3 | 3 | 3 | 3 | 3 | 3 |
| 2 | 2 | 2 | 2 | 2 | 2 | 2 | 2 | 2 |
| 1 | 1 | 1 | 1 | 1 | 1 | 1 | 1 | 1 |
| 0 | 0 | 0 | 0 | 0 | 0 | 0 | 0 | 0 |
| −1 | −1 | −1 | −1 | −1 | −1 | −1 | −1 | −1 |
| −2 | −2 | −2 | −2 | −2 | −2 | −2 | −2 | −2 |
| −3 | −3 | −3 | −3 | −3 | −3 | −3 | −3 | −3 |
| −4 | −4 | −4 | −4 | −4 | −4 | −4 | −4 | −4 |

In a particular embodiment, all values are divided by 540, which is the summation of the absolute values of all elements in the above array of numbers. (A horizontal gradient, not shown, leads to a second scaler value, gradH, discussed below). The resulting values are multiplied by the numerical values (as a function of measured intensity of light) produced by each of the pixels of pixel cell 1804, for example. This multiplication produces two scalar values: gradH and gradV, which apply only to the particular pixel S5-C5, used in this example. Thus, each pixel on an imaging sensor (apart from edges with, say, a 4-pixel buffer) may have two independent gradH and gradV values. The horizontal gradient matrix, HgradMatrix, may be calculated in the same way, using the transpose of the vertical gradient matrix discussed above.

Though examples described herein use 9×9 arrays of pixel values, from 3×3 pixel cells, other size arrays and pixel cells may be used for determining horizontal and vertical gradients, and claimed subject matter is not limited in this way.

Raw numeric values measured by an imaging sensor may be denoted as DN_n_m, where n and m are each integers identifying the location, by row and column, respectively, of the imaging sensor, of the pixel producing the raw numeric value. For example, DN_1_1 denotes the raw numeric value being generated by a pixel at the upper left corner of an imaging sensor.

In a particular example, a pixel_5_5 may have a super cell extending from pixel_1_1 to pixel_1_9, from pixel_1_1 to pixel_9_1, and from pixel_1_1 to pixel_9_9. The process applied to pixel_5_5 may be the same as that applied to each of the pixels of the imaging sensor.

In the example, a single instance of an exposure of an imaging sensor to an image (or more fundamentally, light) may produce the following pixel values (e.g., raw digital, numeric values measured by each pixel) in what is called a DN_Matrix:

$$\begin{matrix} DN\_1\_1 & \ldots & DN\_1\_9 \\ \cdot & & \cdot \\ \cdot & & \cdot \\ \cdot & & \cdot \\ DN\_9\_1 & \ldots & DN\_9\_9 \end{matrix}$$

Dots represent pixel values in between the four corner pixel values. The pixel values may be multiplied by the vertical and horizontal gradient matrices, respectively, and summed. The respective sums are gradV and gradH for pixel_5_5. A full gradient-removal matrix is then formed:

FullGrad=gradV*VgradMatrix+gradH*HgradMatrix

Then a new matrix is calculated:

gradRemovedData=*DN*_Matrix—FullGrad (As a double check that one has done these calculations correctly, if one applies the gradient operators to the gradRemovedData matrix, then its result should be 0's for the gradV and gradH). This gradRemovedData matrix represents a mild low-pass filtering of the data, which then may begin the process of optimally separating P-channel from S-channel solutions.

In some embodiments, the sigmoid operator may be applied to the gradRemovedData to produce the following:

sigmoidMatrix=sign(*DN*_5_5−gradRemovedData)

The sign operator resolves to either+1 or −1 for non-zero values, tracking the sign of the elements. 0 remains 0.

In some embodiments, one can define a weightMatrix to perform an element-by-element multiplication onto the sigmoidMatrix. Values of the weightMatrix can be all ones with all pixels corresponding to S5 pixels being zeroed out. In practice, weightMatrix may have all of its non-zero elements 'trained' by extensive application to large training sets of images in an AI implementation, for example. For the purposes of a first level description of the non-linear demosaicing presented in this example embodiment, the following matrix, called weightMatrixNominal, is considered:

$$\begin{matrix} 1 & 1 & 1 & 1 & 1 & 1 & 1 & 1 & 1 \\ 1 & 0 & 1 & 1 & 0 & 1 & 1 & 0 & 1 \\ 1 & 1 & 1 & 1 & 1 & 1 & 1 & 1 & 1 \\ 1 & 1 & 1 & 1 & 1 & 1 & 1 & 1 & 1 \\ 1 & 0 & 1 & 1 & 0 & 1 & 1 & 0 & 1 \\ 1 & 1 & 1 & 1 & 1 & 1 & 1 & 1 & 1 \\ 1 & 1 & 1 & 1 & 1 & 1 & 1 & 1 & 1 \\ 1 & 0 & 1 & 1 & 0 & 1 & 1 & 0 & 1 \\ 1 & 1 & 1 & 1 & 1 & 1 & 1 & 1 & 1 \end{matrix}$$

In some embodiments, the elements may be treated with zero in a different fashion. As mentioned above, an operationally-trained version of the weightMatrix used in practice may have element values generally decrease from the center of the matrix to the edges. That is, values of 0.1, or some small fraction of unity, for example, as opposed to 1 may be used at the four corner values of an operational weightMatrix.

In some embodiments, one may define spectralSignatureA_i_j as an element-by-element sum (weightMatrixNominal*sigmoidMatrix), where i and j are integers.

SpectralSignatureA_i_j is thus a scalar value and is explicitly unitless. For example, spectralSignatureA_5_5 is a scalar value representing pixel_5_5. As described below, it is a relative measure, set against its neighboring spectralSignatureA_i+n_j+m values (wherein n and m are integers.

The operations to this point are then applied to all pixels in a sensor, with care taken for the partially defined border pixels of the upper and lower 4 rows, for example, and the leftmost and rightmost 4 columns.

In some embodiments, for the elements of weightMatrixNominal that are 0, a second spectralSignatureB_i_j scalar value may be defined. The 'B' variant now concerns pixels which have nominally identical spectral filtering profiles. For example, spectralSignatureB_5_5 is a function of all nine spectralSignatureA_5_5 values of S5. Thus, one needs to first process all of this pixel's spectralSignatureA_5_5 values before one can start processing the spectralSignatureB_5_5 values. SpectralSignatureB_5_5 values are a measurement of self-similarity between like-filtered pixels, with a sub-sampling factor of 3 (though claimed subject matter is not so limited). In the field of consumer and professional photography, good color fidelity over relatively broad patches of pixels may be an important feature. The sub-sampling factor of 3 may assist in color fidelity over these broader patches of pixels.

In some embodiments, one baseline form of self-similarity involves summing the absolute-value differences of the outer eight spectralSignatureA_5_5 values from the center pixel spectralSignatureA_5_5 value. This produces yet another unitless scalar:

spectralSignatureB_5_5=sum(spectralSignatureA_5_5—(spectralSignatureA_2_2, spectralSignatureA_2_5, ... spectralSignatureA_8_8))

Then one can define spectralSig_5_5=W_A*spectralSignatureA_5_5+ W_B*spectralSignatureB_5_5, where W_A and W_B regulate the ratio weights between the two spectral signature values.

Figure 24:
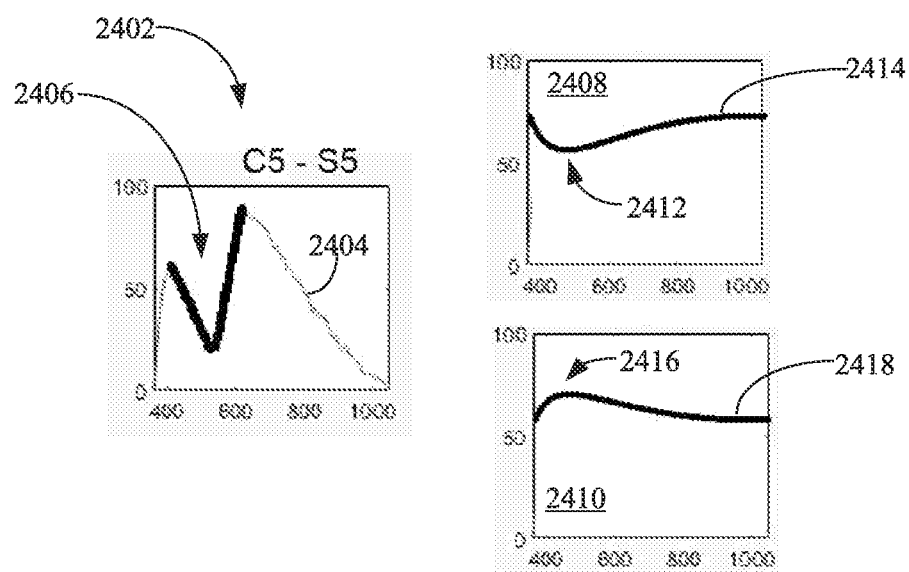
FIG. 24 illustrates a graph of spectral response of some given pixel and how its unique subtraction profile creates spectral differentiation, according to some embodiments.

FIG. 24 illustrates graphs of spectral responses of a pixel of a super-cell, according to some embodiments. A graph 2402 represents a spectral responsivity 2404 of pixel_5_5 of the example above. Responsivity 2404 includes a schematically-illustrated spectral notch 2406, which may be caused by a notch filter in front of pixel_5_5, for example. Graphs 2408 and 2410 illustrate how a final spectralSig_5_5 value may respond to two different 'near grey' spectral distributions of light falling onto pixel C5-S5. If there is a relative dip 2412 in the spectrum 2414 of the incoming light that is spectrally near notch 2406 of the pixel, spectralSig_5_5 will be positive. If there is a relative bump 2416 in the spectrum 2418 of the incoming light that is spectrally near notch 2406 of the pixel, spectralSig_5_5 will be negative.

Figures 25, 26:
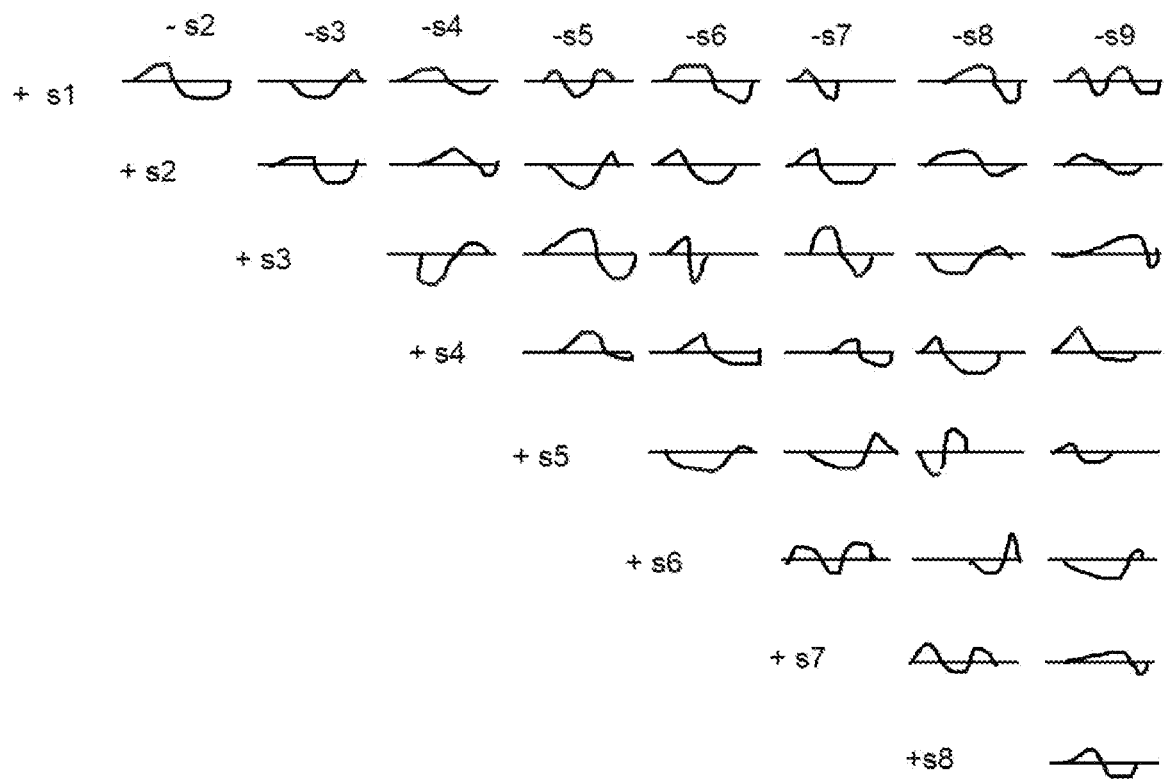
FIG. 25 illustrates pairwise combinations of nine core pixel cells and their unique pair-wise spectral differentiation profiles, according to some embodiments.
FIG. 26 illustrates a numeric example of spectral differentiation values filled within a neighborhood of pixels, according to some embodiments.

FIG. 25 illustrates that all pairwise combinations of pixels (e.g., S1 with S2, S1 with S3, S1 with S4, ... S2 with S3, S2 with S4, S2 with S5, ... and so on) of the nine pixels in the pixel cell and their spectral difference values may be viewed in the representation (e.g., profiles) introduced in FIG. 24. Thus, the relatively simple operation of performing a weighted addition of all 36 of these profiles can produce an initial estimate of the 'relative spectral profile' in the neighborhood of the 3×3 core pixel cell. This becomes a rock solid baseline demosaicing approach for the S-channel solution.

Figure 27:
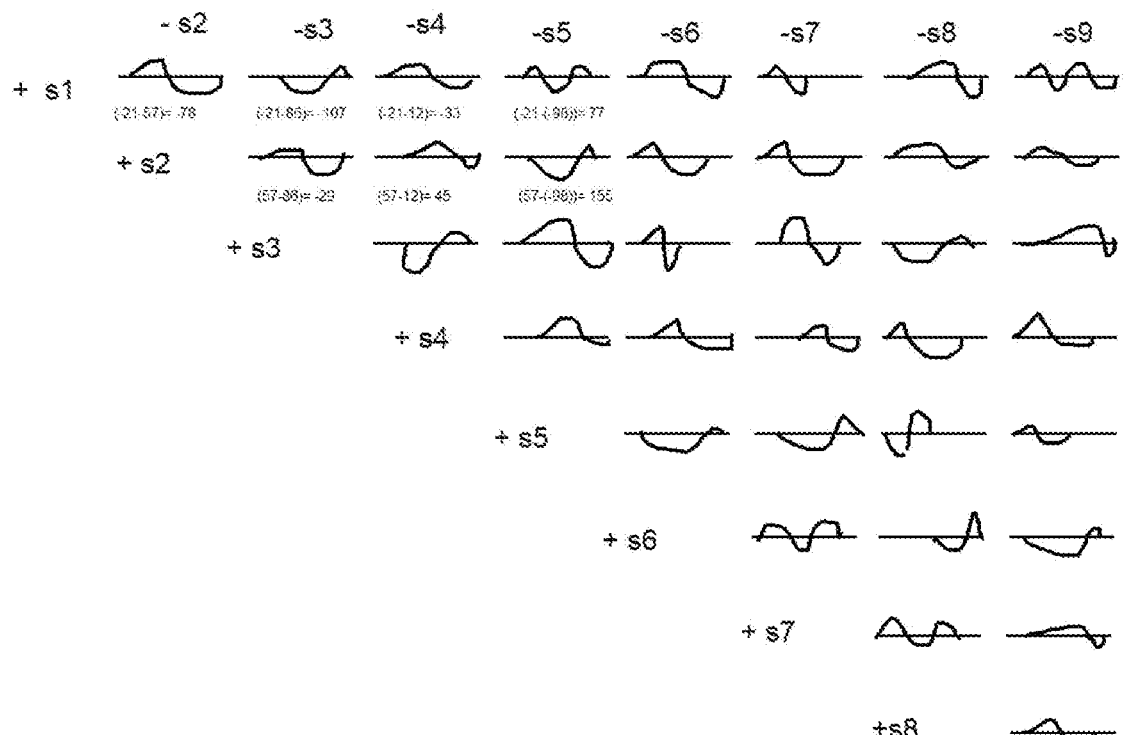
FIG. 27 illustrates pairwise combinations of the nine core pixel cells and their spectral differentiation values with combined resultant 'weights' for the 36 independent difference waveforms using the values of FIG. 26, according to some embodiments.

FIG. 26 illustrates a numeric example to help describe the processes of these embodiments. The illustrated numbers are typical spectralSig values filled within placeholders of the pixels. FIG. 27 overlays the resultant 'weights' for the 36 independent difference waveforms using the values of FIG. 26.

Figure 28:
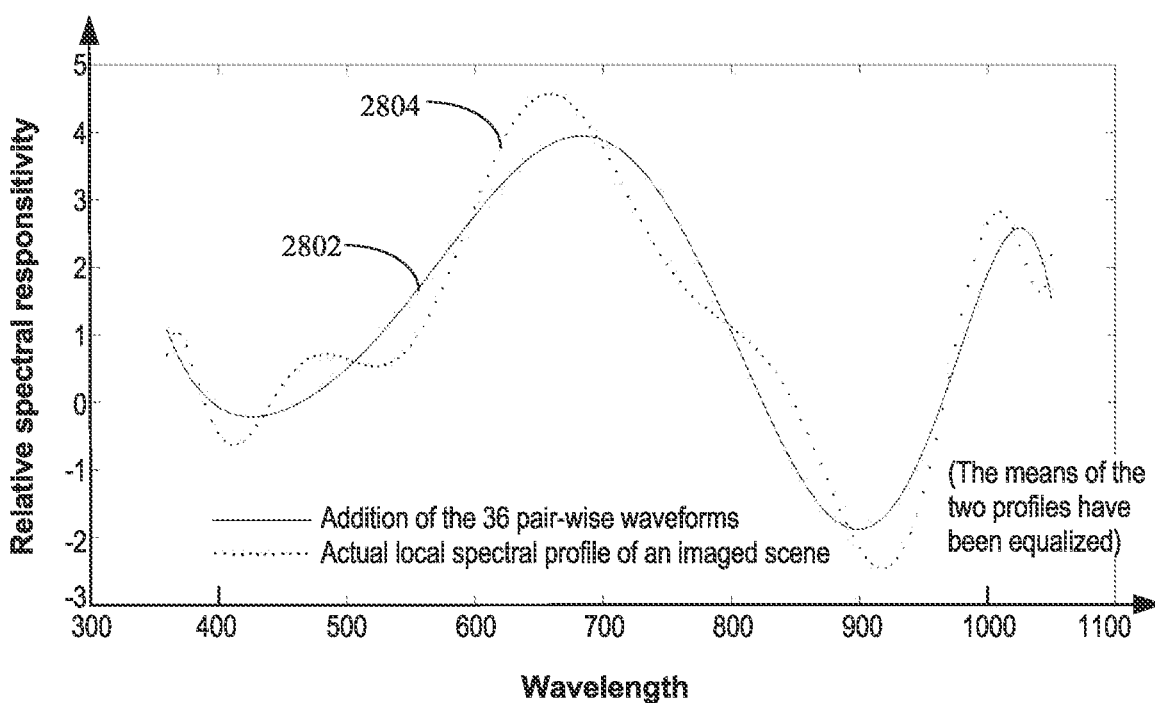
FIG. 28 illustrates an idealized 'smooth' reconstruction of an estimated 'relative' spectral profile, as summed up by the 36 pairwise waveforms with weights, as illustrated in FIG. 27, according to some embodiments.

Based on the example values of FIG. 26 and operations of FIG. 27, FIG. 28 illustrates an idealized 'smooth' reconstruction 2802 of an estimated 'relative' spectral profile, as summed up by the 36 pairwise waveforms with weights, as illustrated in FIG. 27. This is idealized on several levels and is meant to initially convey the intended end result of the non-linear processing steps already described. The dotted line 2804 is meant to convey a generally higher-order shaping of a typical scene spectral profile, while a generally lower-order (typically polynomials of degree 4 for strict color photography and up to 8 or so for RGB+XNIR) polynomial results as an estimate for that local scene spectral profile.

What is essentially missing in the inherent spectral information of FIG. 28 is what is called scale: whether this is largely a grey scene amplifying minor spectral fluctuations, or this is a scene that is relatively colorful and the lower values of the relative spectrum are approaching zero (in a mean-restored version of the estimated spectrum). Comparing curves 2802 and 2804, one can observe a degree of residual non-linearity.

Figure 29:
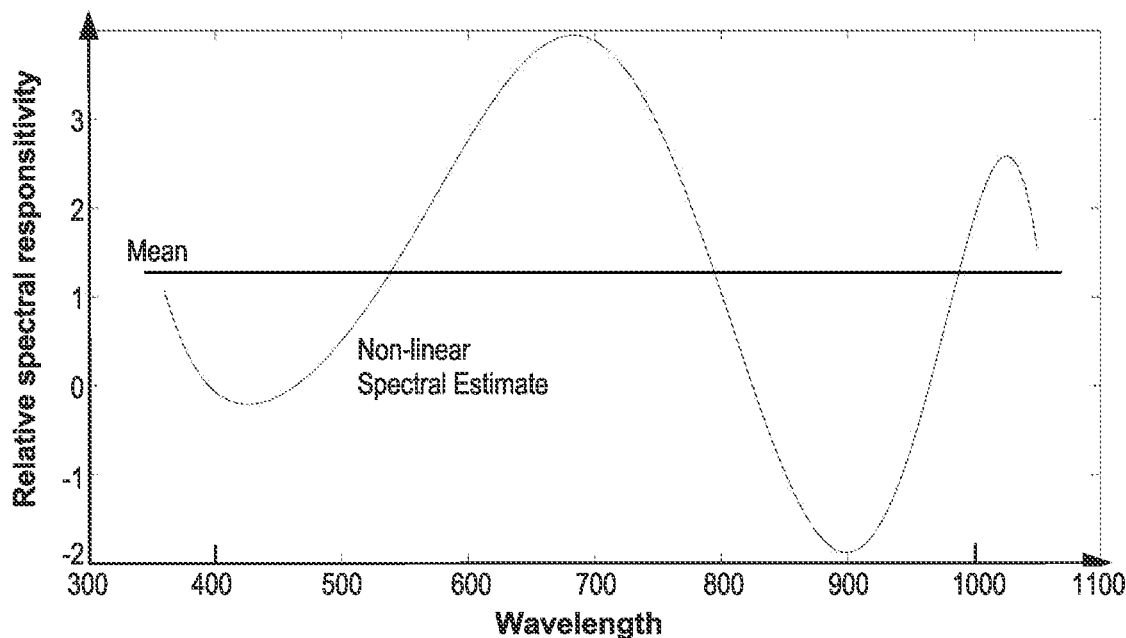
FIGS. 29-33 illustrate how groups of pixels, with their individual spectral profiles, can combine to estimate the profiles of other arbitrarily chosen wavelength profiles, according to some embodiments.

FIG. 29 illustrates a pixel's individual spectral profile estimate and explicitly indicates its mean across all wavelengths of the measured spectrum. The use of the term 'non-linear' is an explicit aid to understanding that these estimated entities, such as the spectral profile estimate, are known to have errors. On the other hand, they can also be relied upon to be reasonable signal to noise estimates, subject to empirical testing. Empirically, the use of non-linear 'sigmoid' comparison operations of pixel pairs, generally involving many dozens of pairs, begins to reproduce quasi-linear behaviors. For example, if one pixel produces a peak-to-valley metric of roughly '6' as illustrated in FIG. 29, and a neighboring pixel has only a peak to valley of '3', empirical testing may show that indeed, the '6' is more color-saturated than the '3', and the linearity of that extra saturation is indeed close to a factor of 2. All of this pseudo-linearity owes its properties to having well over 8 neighbor-sigmoid comparisons per pixel.

Figure 30:
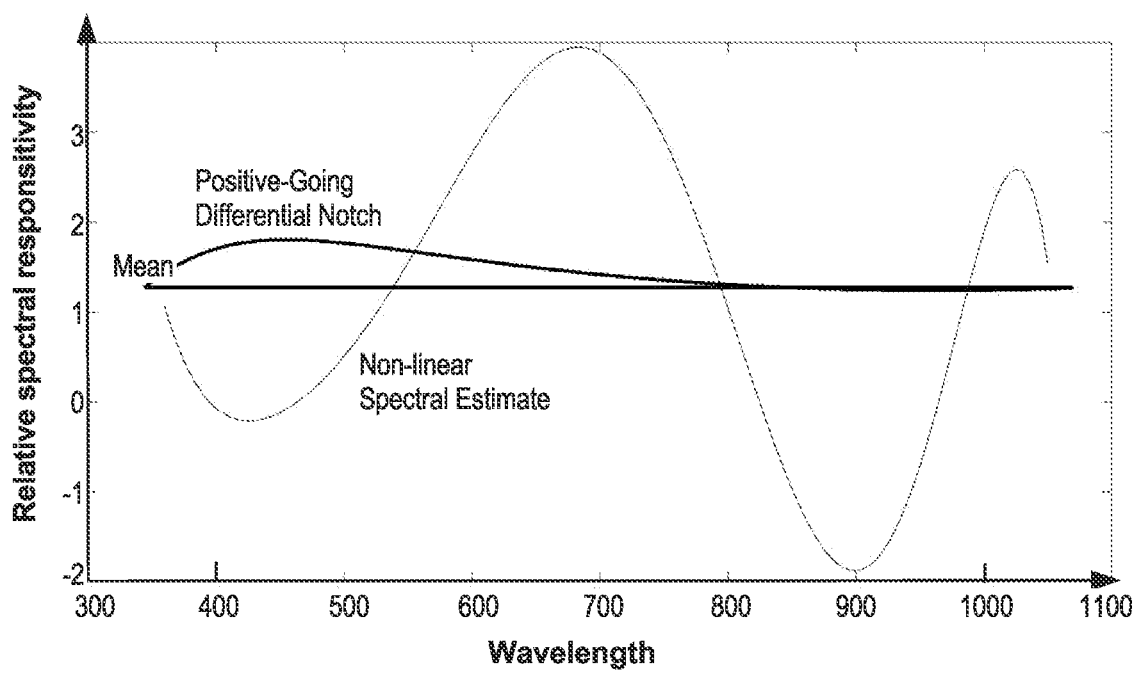

FIG. 30 directly references back to FIG. 24. Here is placed a single pixel's 'differential notch', the 'positive going notch', graphically onto the spectral estimate of FIG. 29. A full spectrum integration of the multiplication of the two overlaid waveforms is then performed. This integration provides an initial indication of whether the correct P-channel value for a given pixel is either going to be a bit higher than a so-called 'grey scene assumption' or a bit lower than that grey scene assumption.

Figure 31:
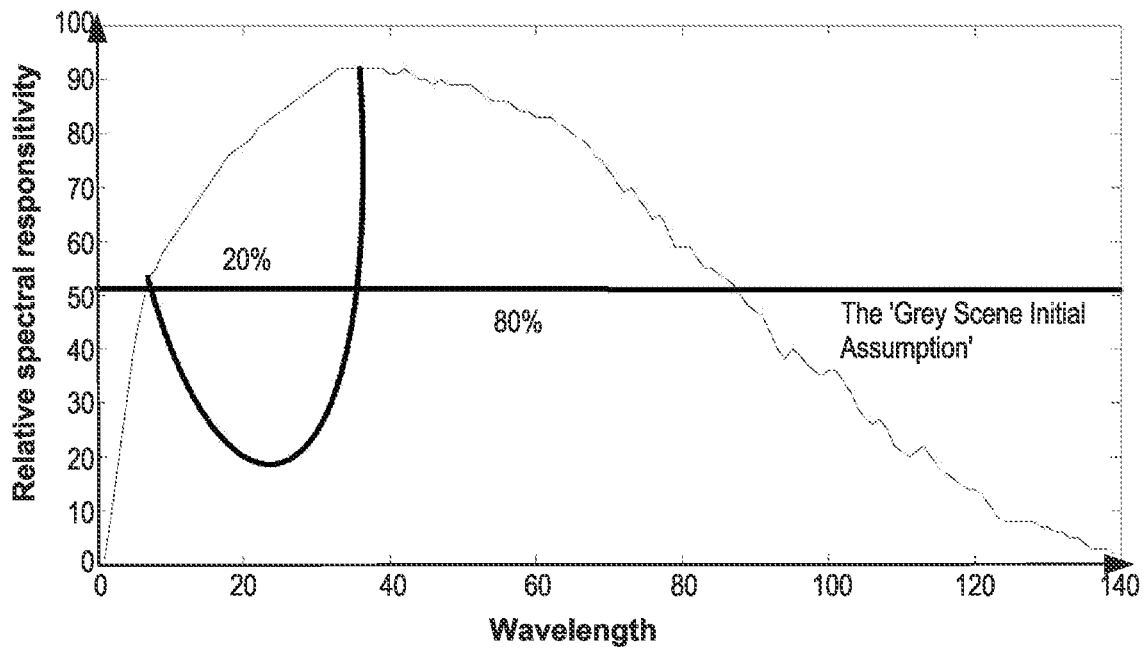

FIG. 31 is one layer deeper on the ideas behind FIG. 30, using a numeric example. If one assumes that each and every pixel is looking at a colorless (e.g., a flat spectral scene with equal energy at wavelengths from say 350 nm to 1050 nm) scene, then one would expect that the raw DN value of some given pixel may be about 20% less than what it would have been had it not included its particular notch. In such a grey scene then, it is a reasonable operation to multiply the pixel's raw measured DN value by 1.25, in order to estimate its proper P-channel solution.

Figure 32:
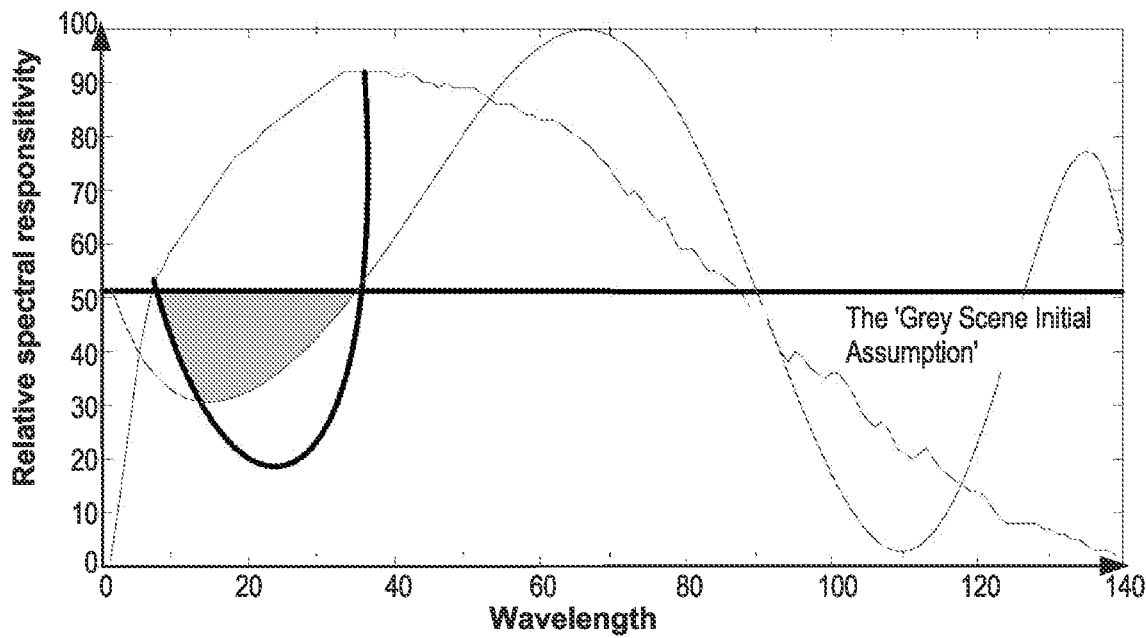

FIG. 32 illustrates some knowledge that in fact the pixel of the previous example and its neighbors are not viewing an all-grey scene, but instead have the crude spectral properties of the overlaid spectral estimate from FIG. 30. Generally, empirically-tuned factors 'K' help to modulation the '1.25' multiplication factor of the grey scene assumption, where K is generally below 1 when the scene spectral profile itself has a 'dip' near where the pixel's notch resides. Likewise, K is above 1 when the spectrum has a positive bump or rise in the vicinity of the pixel's notch.

Figure 33:
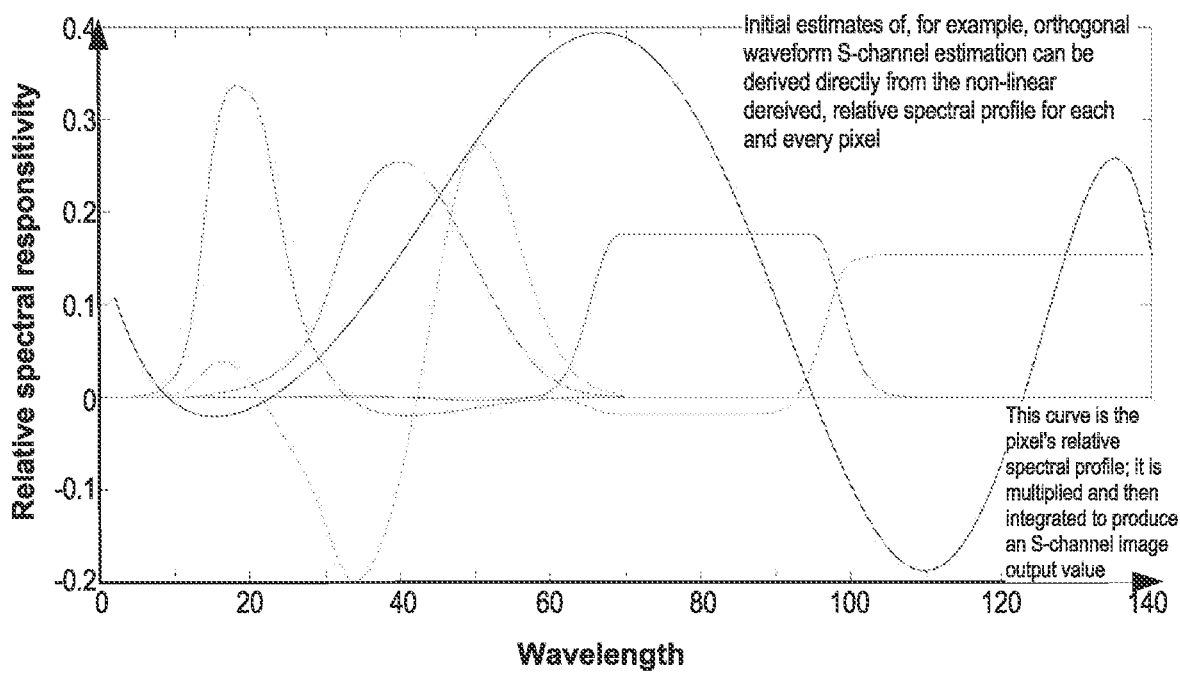

FIG. 33 illustrates one of many examples of how the non-linear estimated spectral profile of any given pixel can then also provide initial estimates for orthogonal (or non-orthogonal) spectral bases functions (functional transformations). This also forms an indirect approach to calculating X, Y, and Z values for a given image, which are the building blocks of a resultant RGB image, after recombination with a monochromatic (or luminance) solution is calculated. One simply multiplies and then integrates the spectral estimate curves with the CIE X, Y, and Z curves. FIGS. 28 through 33 are conveyed in order to communicate some of the subtleties involved in final tuning of combined solutions.

The linear algebraic and non-linear operations described herein may work rather well with machine learning and massive data set training where final empirical tuning may occur. For example, each and every DN produced by a given pixel may become 'weighted' into the accumulation of the P-channel and S-channel solutions within a relatively small neighborhood of pixels around this individual pixel. A typical neighborhood 'kernel reach' of some given pixel might be 5 by 5 or 7 by 7 or 9 by 9, not too much more. The kernel sizes can be different for the P-channel solution and the S-channel solutions. In practice, these kernels may be determined by machine learning on massive image data sets. CNN and other forms of machine learning and AI may determine the linear values of these kernels. In this way, advanced linear kernels may replace the somewhat simpler Bayer-paradigm kernels that are in use today.

The reader is presumed to be familiar with CMOS image sensors and color filter arrays generally. A good introduction to the latter is the original Bayer patent, assigned to Kodak, U.S. Pat. No. 3,971,065. Patent documents US20070230774 (Sony), U.S. Pat. No. 8,314,866 (Omnivision), US20150185380 (Samsung) and US20150116554 (Fujifilm) illustrate other color filter arrays and image sensor arrangements—details of which can be incorporated into embodiments of the present technology (including, e.g., pixels of varying areas, triangular pixels, cells of non-square shapes, etc.). These patent documents are incorporated herein by reference.

Figure 34A:
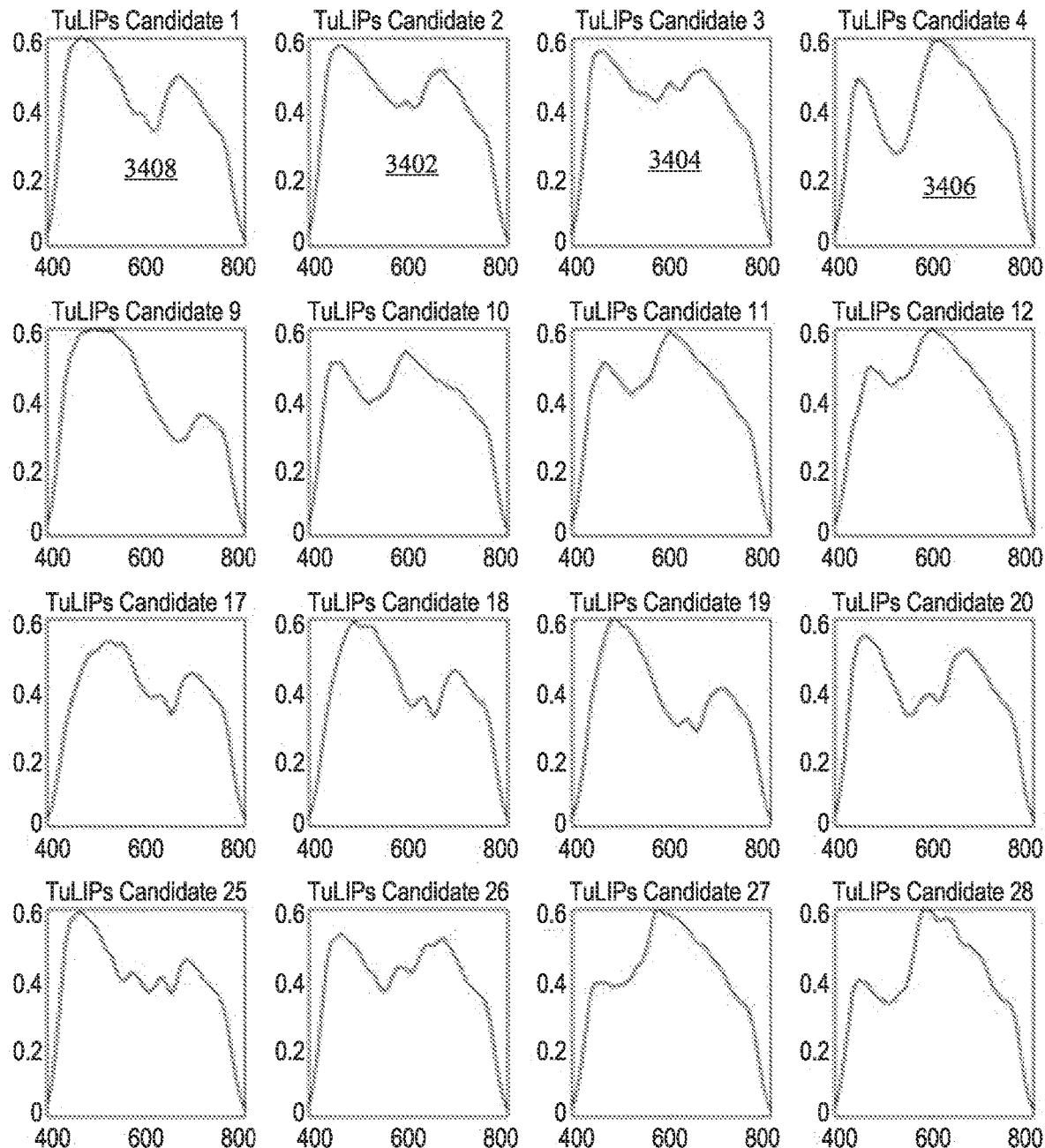
FIGS. 34A and 34B illustrate a set of spectral functions for an inventory of spectral filters, according to some embodiments.
Figure 34B:
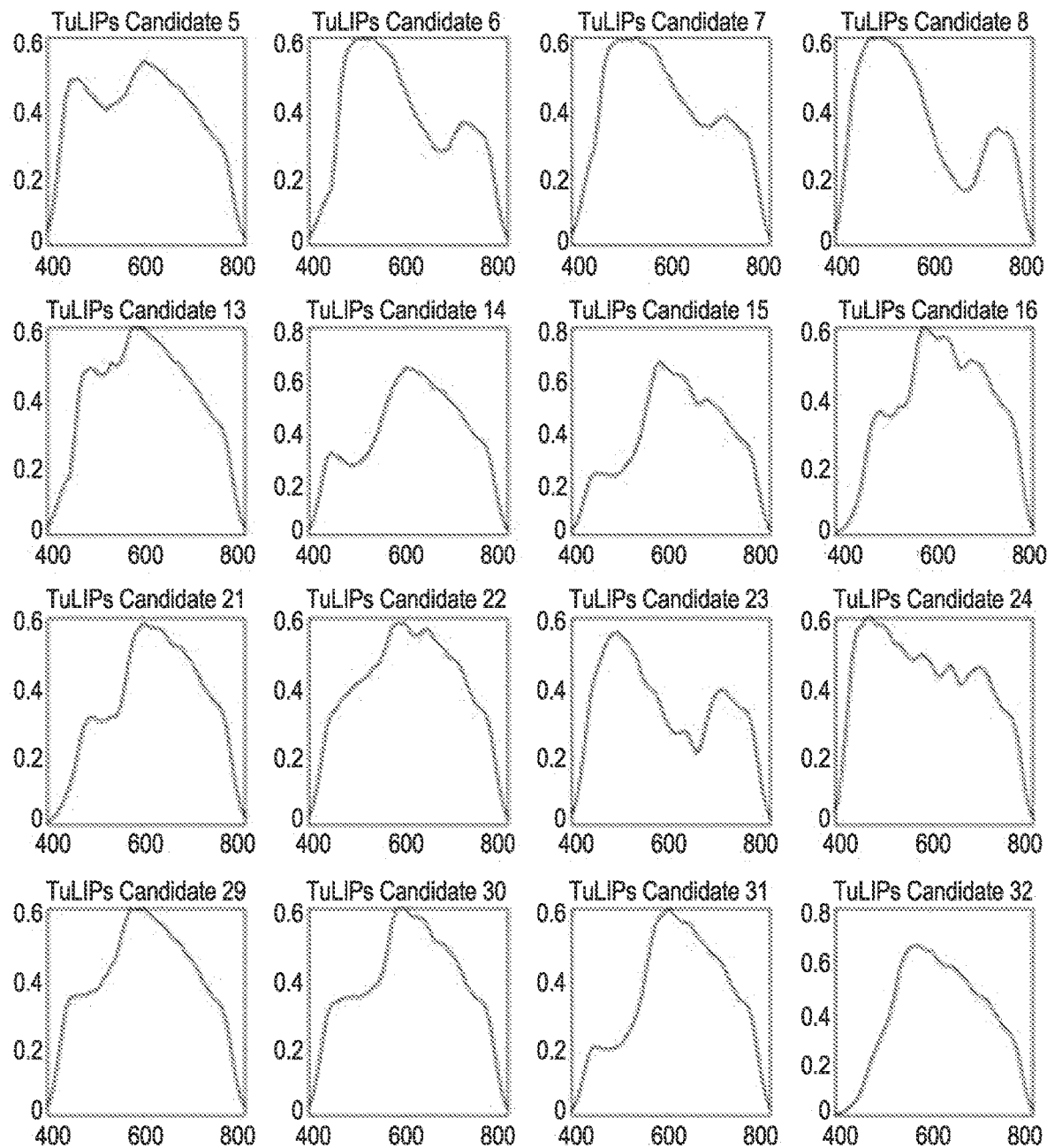

FIGS. 34A and 34B illustrate a set of spectral functions for an inventory of spectral filters, according to some embodiments. As mentioned above, in some particular embodiments, for an imaging device spectral filtering for one pixel of a cell may be different from that of the other pixels of the cell. Filters having such spectral differences may be selected from a relatively large inventory of commercially available and/or physically realizable spectral filtering dyes and pigments. For example, the inventory may include many dozens or even hundreds of spectral functions, such as those of FIGS. 34A and 34B, from which to select, each having varying shapes and slopes in their respective spectral functions. To determine a maximum spectral diversity of a subset of filters among the inventory, the following steps may be performed. For example, a subset of nine filters may be selected from among an inventory of candidate filters having the spectral functions of FIGS. 34A and 34B. The nine selected filters may be placed respectively in front of nine pixels of a cell of an imaging sensor. Accordingly, in view of all the filters available in the inventory from which to make selections, all nine of the selected filters will be as different from one another as possible. For example, spectral diversity of spectral functions 3402 and 3404 is relatively low, but spectral diversity of spectral functions 3402 and 3406 is high. Selecting merely two or three spectral functions with high spectral diversity may be fairly straight forward. However, selecting a greater number of spectral functions from among a set of candidates so as to have a set of functions with a maximum spectral diversity (e.g., a selection that maximizes spectral diversity) may be a relatively extensive process.

Figure 35:
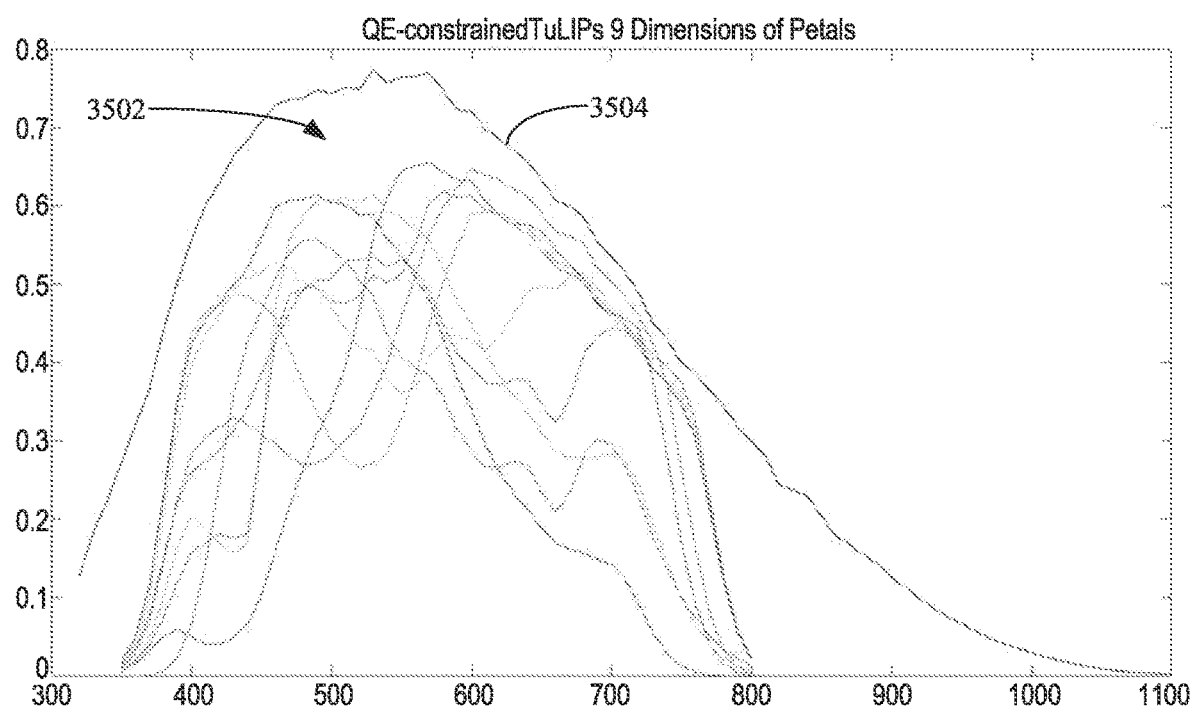
FIG. 35 illustrates spectral functions of nine spectral filters and a silicon-substrate spectral responsivity function, according to some embodiments.

For example, a first step in a selection process may be to select a single initial filter having at least three distinct slopes between 350 nm and 800 nm in its spectral function. For example, the filter having spectral function 3408 may be selected as an initial filter. In a next step, a second filter may be selected and a dot product between its spectral function, such as 3402, and that of the first filter may be calculated. In a next step, a third filter may be selected and a dot product between its spectral function, such as 3404, and that of each of the first two filters may be calculated, resulting in a total of three dot products amongst the three filters. In a next step, a fourth filter may be selected and a dot product between its spectral function and that of each of the first three filters may be calculated, resulting in a total of six dot products. In a next step, a fifth filter may be selected and a dot product between its spectral function and that of each of the first four filters may be calculated, resulting in a total of ten dot products. In a next step, a sixth filter may be selected and a dot product between its spectral function and that of each of the first five filters may be calculated, resulting in a total of fifteen dot products. These steps may be repeated until dot products of pair-combinations of spectral functions of all the filters in the inventory are calculated. For example, these steps may be performed for the 32 candidate filters of FIGS. 34A and 34B, and the number of dot products resulting from these steps may reach into the millions. In a subsequent step, these many combinations may be analyzed to find the 9 most spectrally diverse filters to be used for a 3×3 color filter array cell, such that the combined total dot product of all pairs is minimized. FIG. 35 illustrates spectral functions 3502, selected from among the 32 candidate functions of FIGS. 34A and 34B, of the nine most spectrally diverse filters, as determined by the steps outlined above, for example. Silicon-substrate spectral responsivity function 3504 is also illustrated.

An implementation of the embodiment described above may be a method of manufacturing an imaging device configured to produce image data with relatively high spectral diversity, allowing for creation of information-rich feature vectors. In a particular example of this method, nine of the most spectrally diverse filters will be selected from among 32 candidate filters with their respective spectral functions illustrated in FIGS. 34A and 34B. In other implementations, instead of selecting nine filters, an N number of filters may be selected. For example, N may correspond to the number of pixels in a cell of an imaging sensor, as described above.

The method may include determining the nine most spectrally diverse spectral functions among a set (e.g., an inventory) of spectral functions. The nine spectral filters that correspond to these nine spectral functions may be placed over nine pixels that form a cell on a substrate having a baseline spectral responsivity function. Each of the nine spectral filters may be respectively configured to filter light based on the selected nine spectral functions. In some particular embodiments, determining the most spectrally diverse nine spectral functions comprises calculating dot products of substantially every combination of pairs of spectral functions among the set of spectral functions, and determining sums of substantially every combination of nine of the dot products, wherein the most spectrally diverse nine spectral functions correspond to a combination of the nine dot products having the lowest sum. Other techniques for determining spectral diversity, other than relying on dot products, may be used and claimed subject matter is not limited to any particular technique.

The foregoing description, for purposes of explanation, used specific nomenclature to provide a thorough understanding of the disclosure. However, it will be apparent to one skilled in the art that such specific nomenclature is not required in order to practice the systems and methods described herein. The foregoing descriptions of specific embodiments or examples are presented by way of examples for purposes of illustration and description. They are not intended to be exhaustive of or to limit this disclosure to the precise forms described. Many modifications and variations are possible in view of the above teachings. The embodiments or examples are shown and described in order to best explain the principles of this disclosure and practical applications, to thereby enable others skilled in the art to best utilize this disclosure and various embodiments or examples with various modifications as are suited to the particular use contemplated. It is intended that the scope of this disclosure be defined by the following claims and their equivalents.

I claim:

1. An imaging device configured to produce image data with spectral diversity allowing for creation of information-rich feature vectors, the imaging device comprising:

a substrate having a baseline spectral responsivity function; and a cell fabricated on the substrate and including plural differently spectrally-filtered pixels each comprising a spectral filter configured to filter light to the pixel based on a respective transmission function corresponding to a portion of the baseline spectral responsivity function, wherein two or more of said plural differently spectrally-filtered pixels each has a spectral sensitivity of not less than 20% relative to said baseline spectral responsivity function, throughout a spectral range including 400-700 nm.

2. The imaging device of claim 1, wherein the respective transmission function of each of the spectral filters is substantially different for at least five pixels in the cell.

3. The imaging device of claim 1, wherein all, in aggregate, of the pixels in the cell have at least 40% efficiency of photo-electron generation based on the filtered light as compared to 100% efficiency of unfiltered photo-electron generation of the substrate.

4. The imaging device of claim 1, wherein the respective transmission functions corresponding to at least two of the pixels are approximated by a sixth order or lower polynomial such that the approximation has less than a 5% root mean square error between the approximation and a measured spectral profile of said at least two pixels.

5. The imaging device of claim 1, wherein the respective transmission function of each of the spectral filters is substantially different for a majority of pixels in the cell if the respective transmission function corresponding to any of the pixels is spectrally shifted by any amount.

6. The imaging device of claim 1, in which two or more of said spectrally-filtered pixels in the cell each has an efficiency of at least 50%, at least 70%, or at least 85%, relative to said baseline spectral responsivity function, over said spectral range.

7. The imaging device of claim 1, in which at least one of said filters removes 10-15% of impinging light in said spectral range.

8. The imaging device of claim 1, in which at least one of said filters removes 15-25% of impinging light in said spectral range.

9. The imaging device of claim 1, in which at least one of said filters removes 25-35% of impinging light in said spectral range.

10. The imaging device of claim 1, in which at least one of said filters removes 35-50% of impinging light in said spectral range.

11. The imaging device of claim 1, in which two or more of said plural differently spectrally-filtered pixels each has a spectral sensitivity of not less than 30% relative to said baseline spectral responsivity function, through said spectral range.

12. The imaging device of claim 1, in which the cell of pixels, in the aggregate, has at least 40%, at least 60%, or at least 80% efficiency, relative to said baseline spectral responsivity function.

13. The imaging device of claim 1, comprising four pixels respectively filtered by four different spectral filters, each of said four different spectral filters having a spectral response function including a deepest notch at a different notch wavelength, characterized in that a discrete normalized cross-correlation operation performed between a 100 nm excerpt of one filter spectral response function, centered on said deepest notch of the spectral response function and sampled at intervals of 2 nm or less, with a 100 nm excerpt of another filter spectral response function, centered on the deepest notch of the function and sampled at intervals of 2 nm or less, yields a result less than 0.95, for all pairings of the four filter spectral response functions.

14. The imaging device of claim 13, in which said discrete normalized cross-correlation operation yields a result of less than 0.9 or less than 0.8.

15. The imaging device of claim 1, in which one or more pixels in the cell is null-filtered.

16. The imaging device of claim 1, in which first and second of said pixels have differing spectral response functions, characterized in that a skirt steepness of the first pixel's spectral response function is 15% or more greater than a skirt steepness of the second pixel's spectral response function.

17. The imaging device of claim 1, in which first and second of said pixels have differing spectral response functions, characterized in that the spectral response function of the first pixel has a single notch of depth>5%, and the spectral response function of the second pixel has two or more notches of depth>5%.

18. The imaging device of claim 1, in which first and second of said pixels have differing spectral response functions, characterized in that the spectral response function of the first pixel comprises a deepest notch of a first width and the spectral response function of the second pixel comprises a deepest notch of a second width, wherein the first width is more than 10% different than the second width.

19. The imaging device of claim 1, in which first and second of said pixels have differing spectral response functions, characterized in that the spectral response function of the first pixel comprises a notch having a width of 40 nm or less, and the spectral response function of the second pixel comprises a notch having a width of 100 nm or more.

20. The imaging device of claim 1, in which first and second of said pixels have first and second spectral response functions, the spectral response function of the first pixel including a first deepest notch, the spectral response function of the second pixel including a second deepest notch, wherein a skirt steepness of the first pixel deepest notch is less than 10 nm while a skirt steepness of the second pixel deepest notch is greater than 25 nm.

21. The imaging device of claim 1, in which first and second of said pixels have differing spectral response functions, characterized that a deepest notch in the spectral response function of the first pixel has a width less than 15 nm, while a deepest notch in the spectral response function of the second pixel has a width greater than 50 nm.

22. The imaging device of claim 1, in which first and second of said pixels have differing spectral response functions, characterized that depth of a deepest notch in the spectral response function of the first pixel is more than 40%, while depth of a deepest notch in the spectral response function of the second pixel is in a range of 5-20%.

23. The imaging device of claim 1 that includes plural instances of said cell fabricated on the substrate in a tiled array.

24. The imaging device of claim 1 wherein two or more of said plural differently spectrally-filtered pixels each has a spectral sensitivity of not less than 20% relative to said baseline spectral responsivity function, throughout a spectral range including 400-800 nm.

25. The imaging device of claim 1 wherein two or more of said plural differently spectrally-filtered pixels each has a spectral sensitivity of not less than 20% relative to said baseline spectral responsivity function, throughout a spectral range including 400-1000 nm.

* * * * *